United States Patent
Kanai et al.

(10) Patent No.: US 11,056,526 B2
(45) Date of Patent: *Jul. 6, 2021

(54) IMAGING DEVICE CAMERA SYSTEM AND DRIVING METHOD OF THE SAME

(71) Applicant: Sony Semiconductor Solutions Corporation, Kanagawa (JP)

(72) Inventors: Junichi Kanai, Kanagawa (JP); Nobuo Nakamura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/597,476

(22) Filed: Oct. 9, 2019

(65) Prior Publication Data

US 2020/0043972 A1    Feb. 6, 2020

Related U.S. Application Data

(60) Continuation of application No. 15/358,493, filed on Nov. 22, 2016, now Pat. No. 10,483,314, which is a
(Continued)

(30) Foreign Application Priority Data

Mar. 31, 2006  (JP) .................................. 2006-100931

(51) Int. Cl.
    *H01L 27/00*    (2006.01)
    *H01L 27/146*    (2006.01)
(Continued)

(52) U.S. Cl.
    CPC ...... *H01L 27/14645* (2013.01); *H01L 21/266* (2013.01); *H01L 27/1461* (2013.01);
    (Continued)

(58) Field of Classification Search
    CPC ........... H04N 5/35554; H04N 9/04515; H04N 9/04511; H04N 5/3532; H04N 9/045;
    (Continued)

(56) References Cited

U.S. PATENT DOCUMENTS 4,721,999 A   1/1988  Takemura et al.
5,233,411 A   8/1993  Nam et al.
(Continued)

FOREIGN PATENT DOCUMENTS

JP          07176708       7/1995
JP      HEI 08-023542 A    1/1996
(Continued)

*Primary Examiner* — Georgia Y Epps
(74) *Attorney, Agent, or Firm* — Dentons US LLP

(57) ABSTRACT

An imaging device including an electronic shutter and a pixel array with color pixels with different characteristics of spectral sensitivity arranged. The pixel array part has at least one clear pixel, the plurality of color pixels including at least two of (i) a first color filter pixel having a peak of spectral sensitivity characteristics for red, (ii) a second color filter pixel having a peak for blue, and (iii) a third color filter pixel having a peak for green. The clear pixel has a high transmittance arranged in an oblique pixel array system at a given position of a given row and a given column with respect to the first color filter pixel, the second color filter pixel, and the third color filter pixel. An electronic shutter is separately driven for the at least one clear pixel and for the plurality of color filter pixels.

20 Claims, 39 Drawing Sheets

Related U.S. Application Data continuation of application No. 14/082,953, filed on Nov. 18, 2013, now Pat. No. 9,560,325, which is a continuation of application No. 13/523,374, filed on Jun. 14, 2012, now Pat. No. 8,598,508, which is a continuation of application No. 12/703,704, filed on Feb. 10, 2010, now Pat. No. 8,227,737, which is a division of application No. 11/688,564, filed on Mar. 20, 2007, now Pat. No. 7,671,316.

(51) Int. Cl.

| | | |
|---|---|---|
| *H04N 9/04* | (2006.01) | |
| *H04N 5/353* | (2011.01) | |
| *H04N 5/355* | (2011.01) | |
| *H01L 21/266* | (2006.01) | |

(52) U.S. Cl.
CPC .. *H01L 27/14605* (2013.01); *H01L 27/14621* (2013.01); *H01L 27/14627* (2013.01); *H01L 27/14647* (2013.01); *H01L 27/14689* (2013.01); *H04N 5/3532* (2013.01); *H04N 5/3535* (2013.01); *H04N 5/3537* (2013.01); *H04N 5/35554* (2013.01); *H04N 9/045* (2013.01); *H04N 9/04511* (2018.08); *H04N 9/04515* (2018.08); *H04N 9/04559* (2018.08); *H01L 27/14603* (2013.01); *H04N 2209/045* (2013.01)

(58) Field of Classification Search
CPC ......... H01L 27/14645; H01L 27/14621; H01L 27/14689; H01L 27/14627; H01L 27/14647; H01L 27/1461
USPC ..................................................... 250/208.1
See application file for complete search history.

(56) References Cited

U.S. PATENT DOCUMENTS

| | | | |
|---|---|---|---|
| 5,379,069 | A | 1/1995 | Tani |
| 5,708,264 | A | 1/1998 | Hawkins et al. |
| 6,714,243 | B1 | 3/2004 | Mathur et al. |
| 6,847,397 | B1 | 1/2005 | Osada |
| 6,876,384 | B1 | 4/2005 | Hubina et al. |
| 7,400,332 | B2 | 7/2008 | Schweng et al. |
| 7,505,206 | B2 | 3/2009 | Deng et al. |
| 2001/0024237 | A1 | 9/2001 | Osada et al. |
| 2003/0086008 | A1 | 5/2003 | Nagano |
| 2004/0178478 | A1 | 9/2004 | Shizuishi |
| 2004/0263652 | A1 | 12/2004 | Oda |
| 2005/0225563 | A1 | 10/2005 | Brown et al. |
| 2006/0038953 | A1 | 2/2006 | Moriya |
| 2007/0177026 | A1 | 8/2007 | Sakai |
| 2009/0200623 | A1 | 8/2009 | Qian et al. |
| 2011/0205410 | A1 | 8/2011 | Ahn |
| 2014/0240492 | A1* | 8/2014 | Lee ................ H04N 5/23219 348/136 |
| 2014/0313380 | A1* | 10/2014 | Aoki ................ H04N 5/335 348/280 |
| 2016/0111461 | A1* | 4/2016 | Ahn ................ H01L 27/14612 250/208.1 |

FOREIGN PATENT DOCUMENTS

| | | |
|---|---|---|
| JP | HEI 11-355790 A | 12/1999 |
| JP | 2002-135792 A | 5/2002 |
| JP | 2004-304706 A | 10/2004 |
| JP | 2007-258686 A | 4/2007 |

* cited by examiner

FIG. 28

FIG. 29
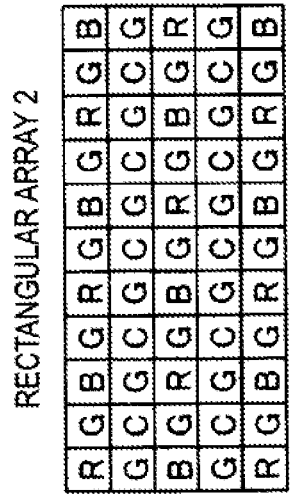
RECTANGULAR ARRAY 2
ROTATE PIXELS AT 45°
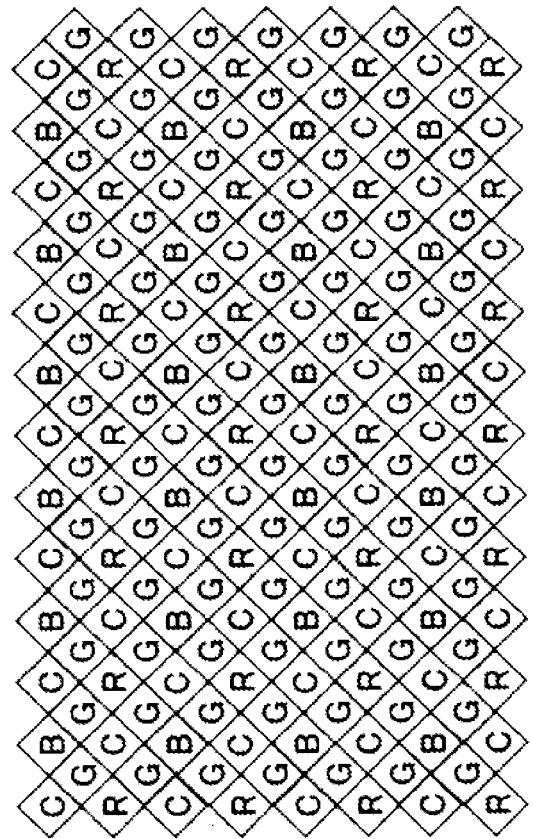
ARRAY 2 (FIG. 9)

FIG. 30
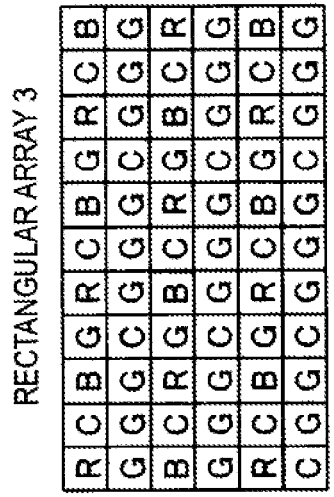
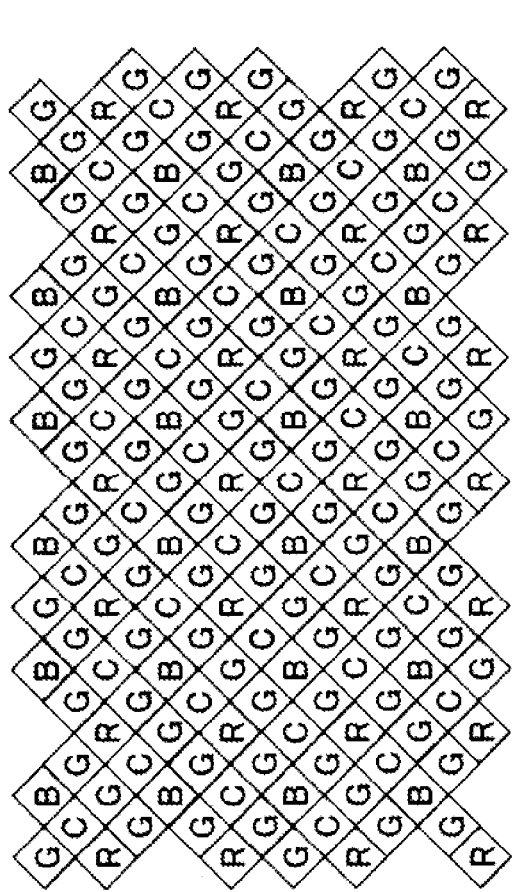

FIG. 31

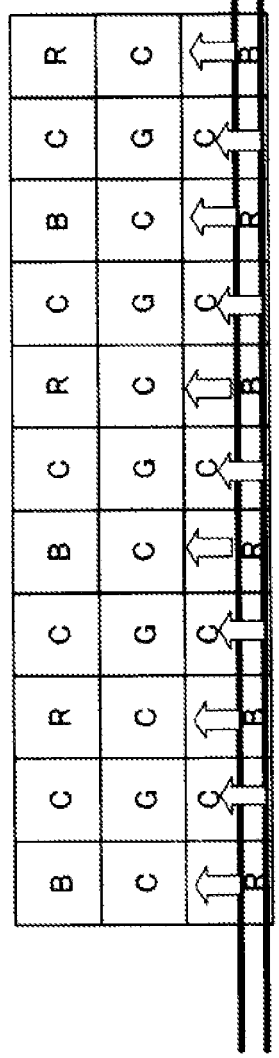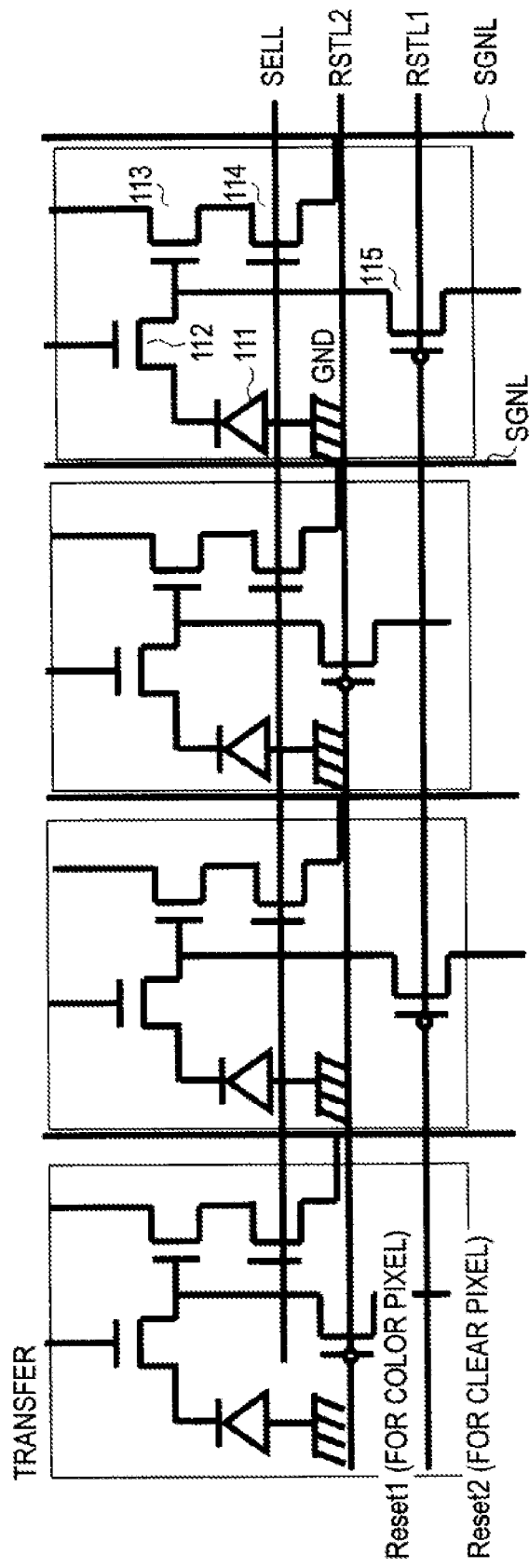
FIG. 37

FIG. 38
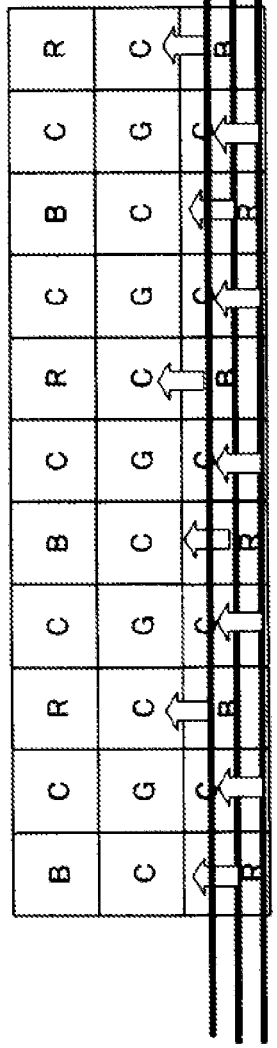
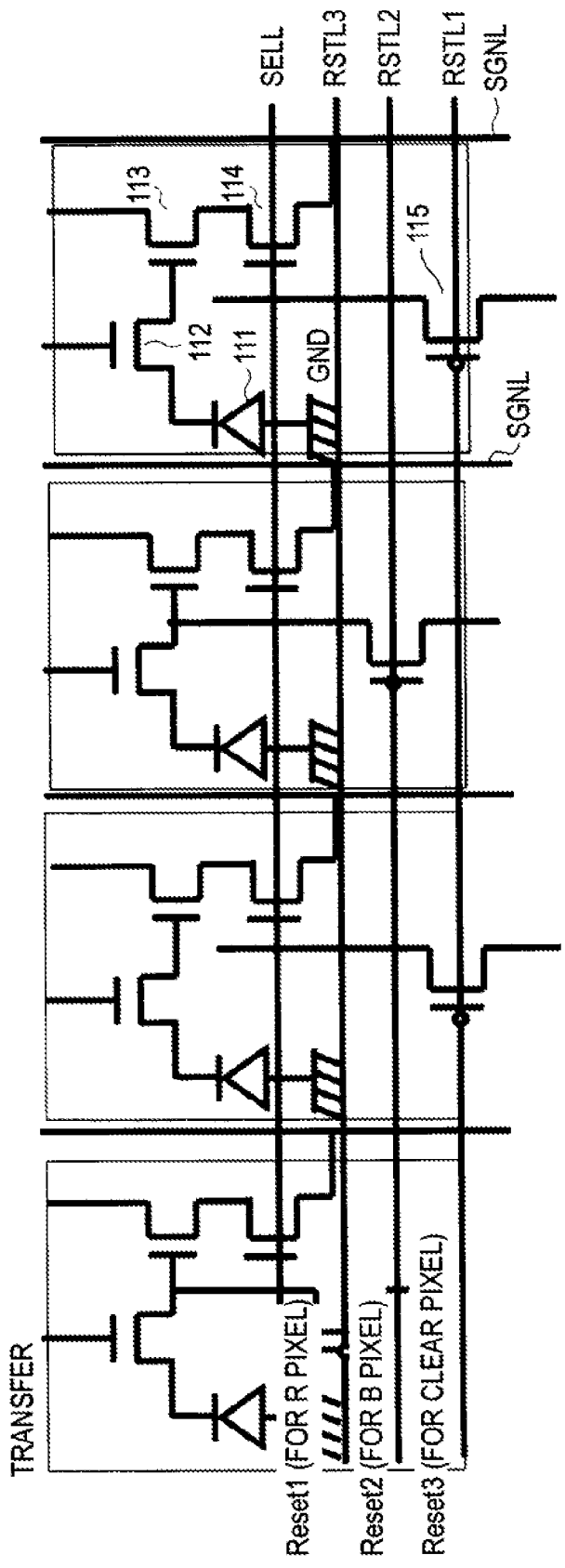

IMAGING DEVICE CAMERA SYSTEM AND DRIVING METHOD OF THE SAME

RELATED APPLICATION DATA

This application is a continuation of U.S. patent application Ser. No. 15/358,493 filed Nov. 22, 2016, which is a continuation of U.S. patent application Ser. No. 14/082,953 filed Nov. 18, 2013, now U.S. Pat. No. 9,560,325 issued Jan. 31, 2017, which is a continuation of U.S. patent application Ser. No. 13/523,374, filed on Jun. 14, 2012, now U.S. Pat. No. 8,598,508 issued Dec. 3, 2013, which is a continuation of U.S. patent application Ser. No. 12/703,704 filed Feb. 10, 2010, now U.S. Pat. No. 8,227,737 issued Jul. 24, 2012, which is a divisional of U.S. patent application Ser. No. 11/688,564, filed Mar. 20, 2007, now issued as U.S. Pat. No. 7,671,316 issued Mar. 2, 2010, the entireties of which are incorporated herein by reference to the extent permitted by law. The present invention claims priority to and contains subject matter related to Japanese Patent Application JP 2006-100931 filed in the Japanese Patent Office on Mar. 31, 2006, the entire contents of which being incorporated herein by reference to the extent permitted by law.

BACKGROUND OF THE INVENTION

1. Field of the Invention

The present invention relates to an imaging device, a camera system and a driving method of the same, provided with a solid state imaging device such as a CCD (Charge Coupled Device), and a CMOS (Complementary Metal Oxide Semiconductor) sensor, particularly to an imaging device and a camera system in which in a two dimensional pixel array using a plurality of color filters, the pixel arrangement and the pixel array are sequentially scanned for exposure and read operation.

2. Description of the Related Art

For a color filter arrangement of an imaging device, the Bayer array is known which uses two green (G) filters, a single red (R) filter, and a single blue (B) filter of three primary colors with excellent color reproducibility. The Bayer array is an arrangement that places more importance on the resolution of brightness than color.

An imaging device is proposed in which a pixel arrangement is provided with transparent filters arranged in order to increase sensitivity while excellent color reproducibility is retained in the color filter arrangement (for example, see JP-A-8-23542 (Patent Reference 1)).

In addition, an imaging device is proposed in which the transparent filter arrangement is improved to secure the signal charge amount and the color resolution even though pixels are miniaturized (for example, see JP-A-2004-304706 (Patent Reference 2)).

SUMMARY OF THE INVENTION

However, in the imaging device described above, the apparatus has limitations on the improvement of resolution and color reproducibility.

In addition, it is difficult to control color information at dark places and bright places using color filter pixels and transparent filter pixels freely, and it is difficult to create almost natural color depending on luminosity.

Thus, it is desirable to provide an imaging device and a camera system with excellent color reproducibility which can improve resolution.

It is also desirable to provide an imaging device and a camera system which can create almost natural color depending on luminosity.

An imaging device according to an embodiment of the invention is an imaging device including: a pixel array part in which a plurality of pixels with different characteristics of spectral sensitivity are arranged in an array and which converts light transmitted through the pixel is converted into an electric signal, wherein in the pixel array part, among a first color filter pixel having a peak of spectral sensitivity characteristics in red, a second color filter pixel having a peak in blue, and a third color filter pixel having a peak in green, each including a color filter, at least a plurality of the first color filter pixels and the second color filter pixels is arranged in an oblique pixel array system, and a clear pixel having a high transmittance is arranged in an oblique pixel array system at a given position of a given row and a given column in the oblique pixel array with respect to the first color filter pixel, the second color filter pixel, and the third color filter pixel.

The oblique pixel array means that the pixels of the columns of each series are offset by a predetermined amount from the pixels of the columns of the other series.

Preferably, in the pixel array part, a first color filter pixel having a peak of spectral sensitivity characteristics in red, a second color filter pixel having a peak in blue, and a third color filter pixel having a peak in green, each including a color filter are arranged in an array, and the clear pixel is uniformly arranged between the color filter pixels.

Preferably, the pixel array part includes a pixel row and a pixel column formed only of the clear pixel.

In addition, another pixel array part includes a pixel row and a pixel column formed only of the clear pixel.

Preferably, the pixel array part includes a pixel row and/or a pixel column having the clear pixel and at least one color filter pixel mixed.

Preferably, a read channel exclusive for the clear pixel and a read channel exclusive for the color filter pixel are provided separately.

Preferably, a function is provided that separately performs electronic shutter drive for the clear pixel and for the color filter pixel.

An imaging device according to an embodiment of the invention is an imaging device including: a pixel array part in which a plurality of pixels with different characteristics of spectral sensitivity are arranged in an array and which converts light transmitted through the pixel into an electric signal, wherein in the pixel array part, among a first color filter pixel having a peak of spectral sensitivity characteristics in red, a second color filter pixel having a peak in blue, and a third color filter pixel having a peak in green, each including a color filter, at least a plurality of the first color filter pixels and the second color filter pixels is arranged in an array, a clear pixel having a high transmittance is arranged at a given position of a given row and a given column in the array pixel arrangement with respect to the first color filter pixel, the second color filter pixel, and the third color filter pixel, and a read channel exclusive for the clear pixel and a read channel exclusive for the color filter pixel are separately provided.

An imaging device according to an embodiment of the invention is an imaging device including: a pixel array part in which a plurality of pixels with different characteristics of spectral sensitivity are arranged in an array and which converts light transmitted through the pixel into an electric signal, wherein in the pixel array part, among a first color filter pixel having a peak of spectral sensitivity characteristics in red, a second color filter pixel having a peak in blue, and a third color filter pixel having a peak in green, each including a color filter, at least a plurality of the first color filter pixels and the second color filter pixels is arranged in an array, a clear pixel having a high transmittance is arranged at a given position of a given row and a given column in the array pixel arrangement with respect to the first color filter pixel, the second color filter pixel, and the third color filter pixel, and a function is provided that separately performs electronic shutter drive for the clear pixel and for the color filter pixel.

A camera system according to an embodiment of the invention is a camera system including: an imaging device; an optical system operable to lead incident light to an imaging part of the imaging device; and a signal processing circuit operable to process an output signal of the imaging device, wherein the imaging device includes: a pixel array part in which a plurality of pixels with different characteristics of spectral sensitivity are arranged in an array and which converts light transmitted through the pixel into an electric signal, wherein in the pixel array part, among a first color filter pixel having a peak of spectral sensitivity characteristics in red, a second color filter pixel having a peak in blue, and a third color filter pixel having a peak in green, each including a color filter, at least a plurality of the first color filter pixels and the second color filter pixels is arranged in an oblique pixel array system, a clear pixel having a high transmittance is arranged in an oblique pixel array system at a given position of a given row and a given column in the oblique pixel array with respect to the first color filter pixel, the second color filter pixel, and the third color filter pixel, a read channel exclusive for the clear pixel and a read channel exclusive for the color filter pixel are separately provided, and a function is provided that separately performs electronic shutter drive for the clear pixel and for the color filter pixel.

A camera system according to an embodiment of the invention is a camera system including: an imaging device; an optical system operable to lead incident light to an imaging part of the imaging device; and a signal processing circuit operable to process an output signal of the imaging device, wherein the imaging device includes: a pixel array part in which a plurality of pixels with different characteristics of spectral sensitivity are arranged in an array and which the light transmitted through the pixel is converted into an electric signal, wherein in the pixel array part, among a first color filter pixel having a peak of spectral sensitivity characteristics in red, a second color filter pixel having a peak in blue, and a third color filter pixel having a peak in green, each including a color filter, at least a plurality of the first color filter pixels and the second color filter pixels is arranged in an array, a clear pixel having a high transmittance is arranged at a given position of a given row and a given column in the array pixel arrangement with respect to the first color filter pixel, the second color filter pixel, and the third color filter pixel, a read channel exclusive for the clear pixel and a read channel exclusive for the color filter pixel are separately provided, and a function is provided that separately performs electronic shutter drive for the clear pixel and for the color filter pixel.

According to an embodiment of the invention, an imaging device can be implemented which intends an improved resolution with excellent color reproducibility.

In addition, according to an embodiment of the invention, almost natural color can be created depending on luminosity.

BRIEF DESCRIPTION OF THE DRAWINGS

Figure 28:
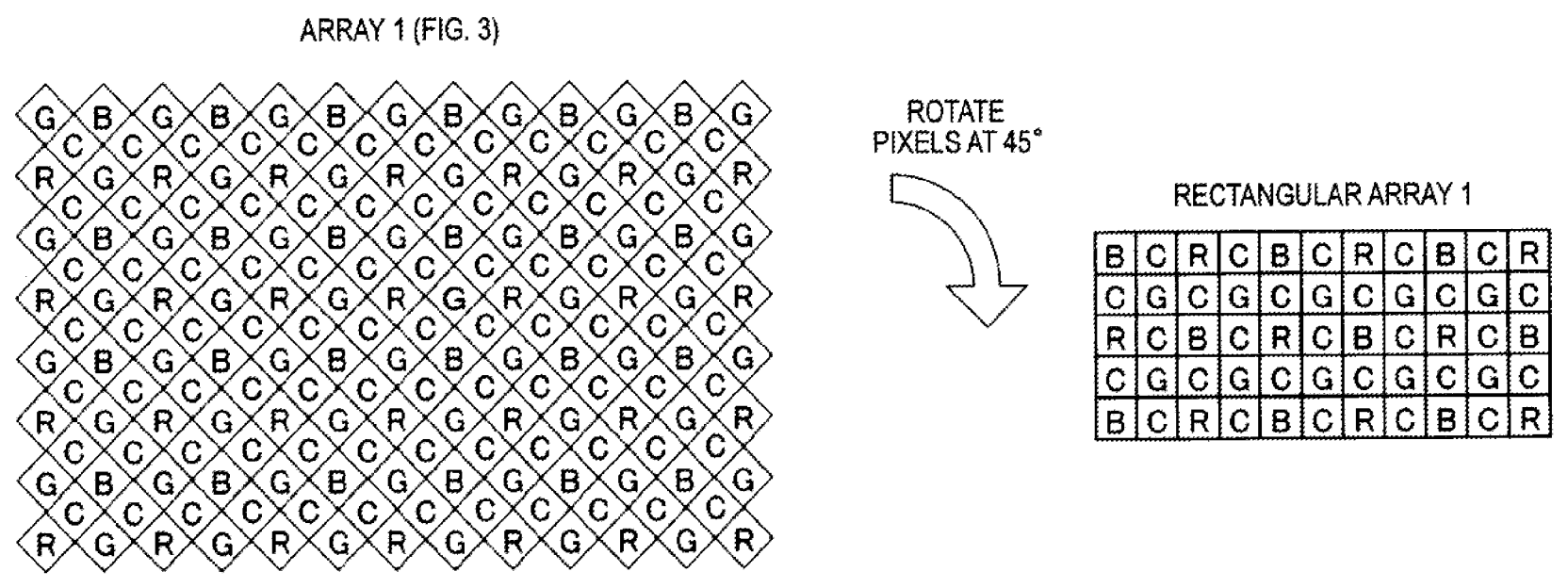

FIG. 28 shows a diagram depicting an example in which the oblique pixel array shown in FIG. 4 is rotated into the rectangular array;

FIG. 29 shows a diagram depicting an example in which the oblique pixel array shown in FIG. 19 is rotated into the rectangular array;

FIG. 30 shows a diagram depicting an example in which the oblique pixel array shown in FIG. 21 is rotated into the rectangular array;

Figure 31:
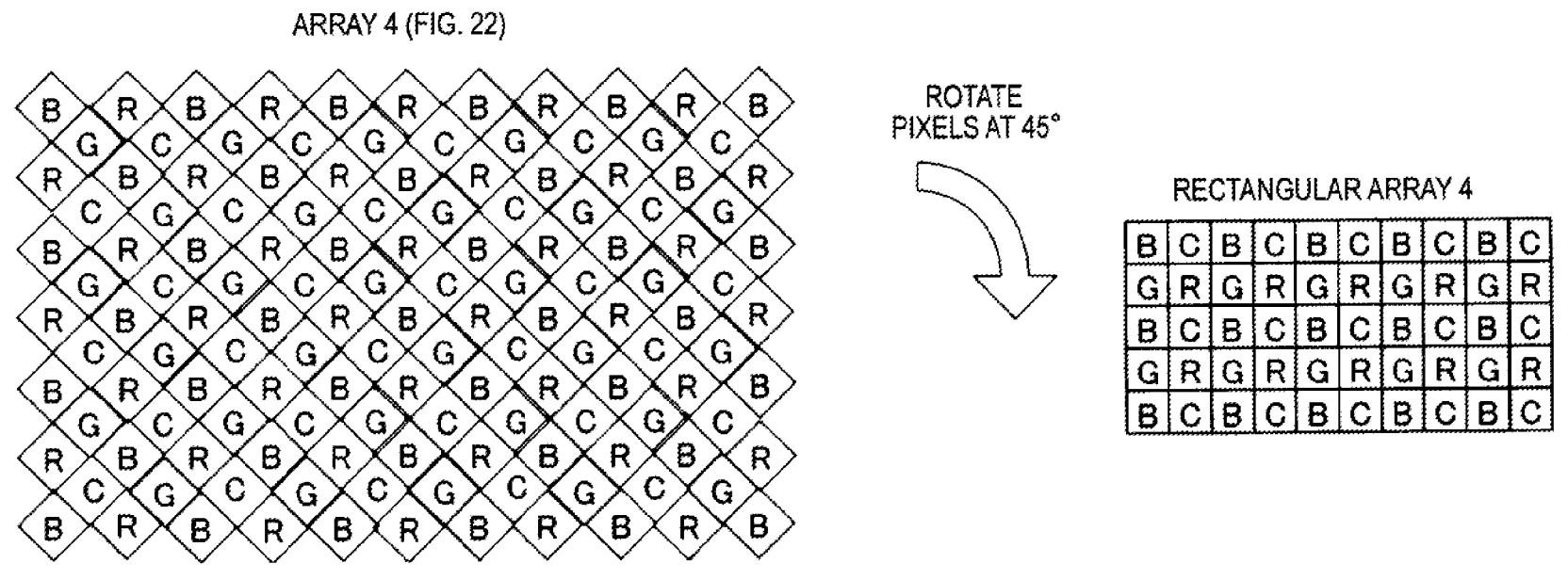

FIG. 31 shows a diagram depicting an example in which the oblique pixel array shown in FIG. 22 is rotated into the rectangular array;

FIG. 37 shows a diagram depicting an exemplary configuration in which the clear pixels and color filter pixels are mixed in the same row in the rectangular array;

FIG. 38 shows a diagram depicting an exemplary configuration in which a shutter wiring is provided to each of color filter pixels and clear pixels in the rectangular array.

DETAILED DESCRIPTION OF THE INVENTION

Hereinafter, an embodiment of the invention will be described with reference to the drawings.

Figure 1:
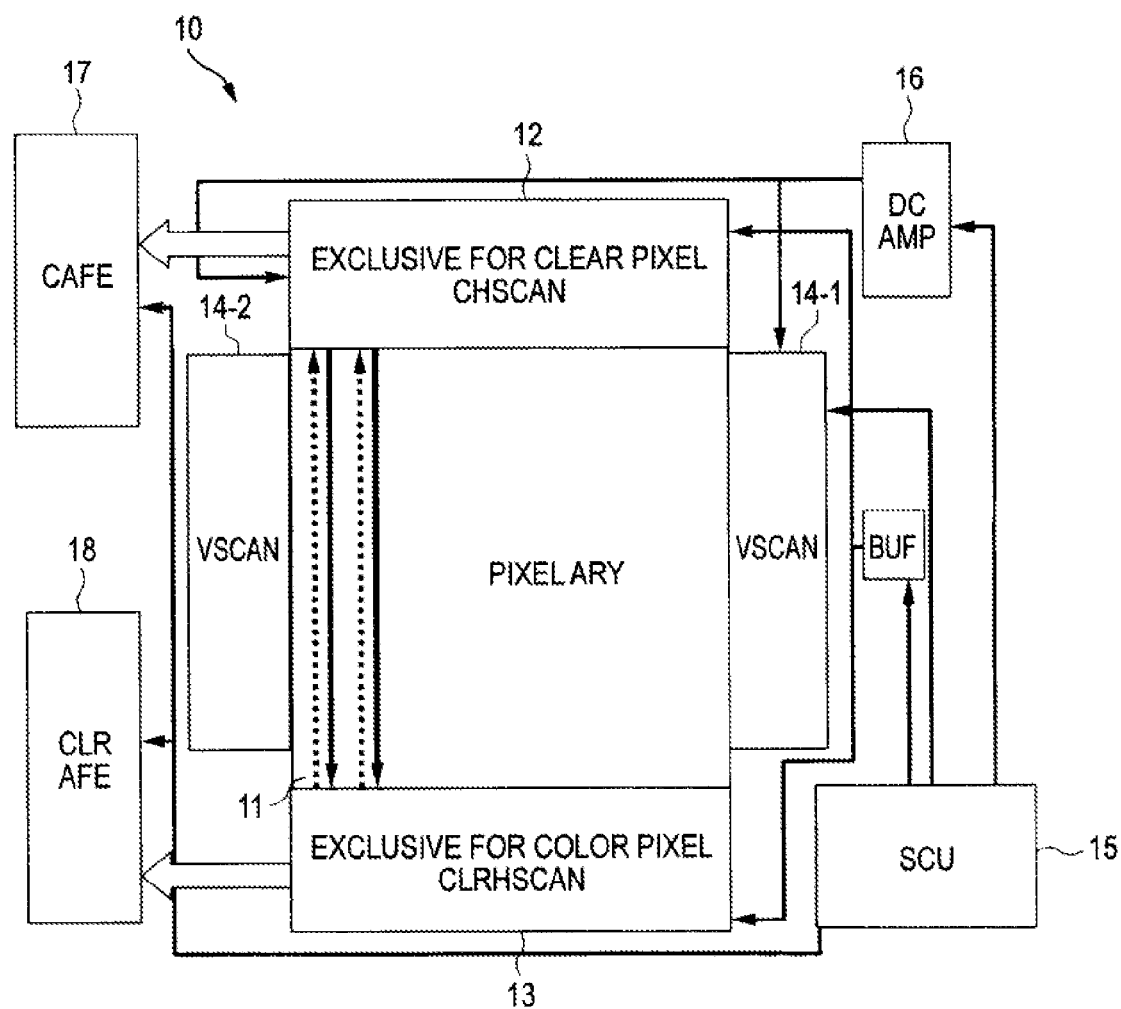
FIG. 1 shows a block diagram depicting an exemplary configuration of the essential part of an imaging device according to an embodiment of the invention.

FIG. 1 shows a block diagram depicting an exemplary configuration of the essential part of an imaging device according to an embodiment of the invention.

As shown in FIG. 1, an imaging device 10 has a pixel array part (ARY) 11, a clear pixel horizontal scanning circuit (CHSCAN) 12, a color pixel horizontal scanning circuit (CLRHSCAN) 13, a vertical scanning circuits (VSCAN) 14-1 and 14-2, a timing control part 15, a power source part 16, a clear pixel analog front end part (CAFE) 17, and a color pixel analog front end part (CLRAFE) 18.

For example, in the pixel array part 11, sensor unit pixels are arranged in an array in a predetermined arrangement form.

In addition, the pixel array part 11 is wired with a transfer selection line, a reset line, and a select line in each row in the pixel arrangement, and a signal line in each column in the pixel arrangement.

Figure 2:
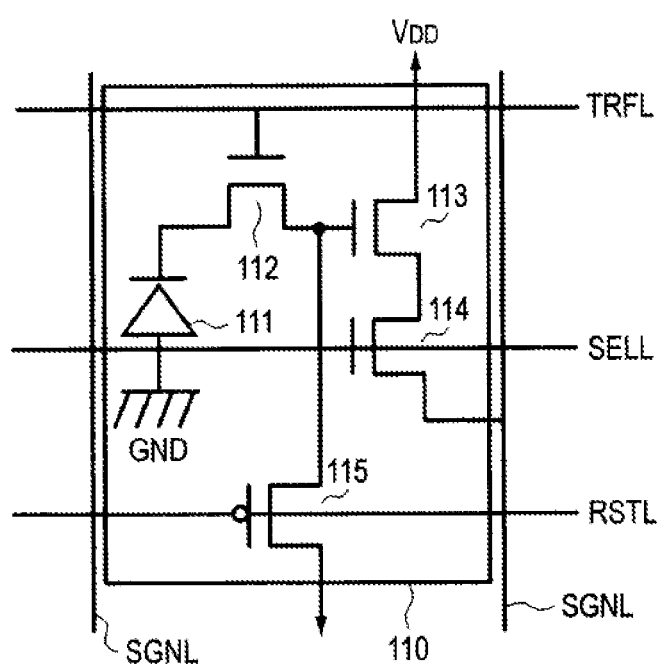
FIG. 2 shows a circuit diagram depicting an exemplary unit pixel according to the embodiment.

FIG. 2 shows a circuit diagram depicting an exemplary unit pixel according to the embodiment. In FIG. 2, a CMOS sensor is shown as an example.

A unit pixel 110 shown in FIG. 2 has a photodiode 111, a transfer transistor 112, an amplifier transistor 113, a select transistor 114, a reset transistor 115, and a floating node ND 111.

The photodiode 111 photoelectrically converts incident light into signal charge in the amount of electric charge in accordance with the light quantity (for example, electrons).

The transfer transistor 112 is connected between the cathode of the photodiode 111 and the floating node ND 111, and the gate is connected to a transfer selection line TRFL, which has a function that it is conducted (turned on) to transfer the signal charge stored in the photodiode 111 to the floating node ND 111.

The amplifier transistor 113 and the select transistor 114 are serially connected between a power source potential VDD and a signal line SGNL.

The gate of the amplifier transistor 113 is connected to the floating node ND 111, which amplifies the potential of the floating node ND 111, and outputs it to the signal line SGNL through the select transistor 114.

The gate of the select transistor 114 is connected to a select line SELL.

In the reset transistor 115, the source is connected to the floating node ND 111, the drain is connected to a predetermined potential line, and the gate is connected to a reset line RSTL, which has a function that resets the potential of the floating node ND 111.

The transfer selection line TRFL, the select line SELL, and the reset line RSTL which are wired to each row in the pixel arrangement are selectively driven by the vertical scanning circuit 14. The signal line SGNL selectively transfers signals read out of pixels to the clear pixel horizontal scanning circuit 12, and the color pixel horizontal scanning circuit 13.

The drive timing of the horizontal scanning circuits 12 and 13 and the vertical scanning circuit 14 is controlled by the timing control part 15.

Figure 3:
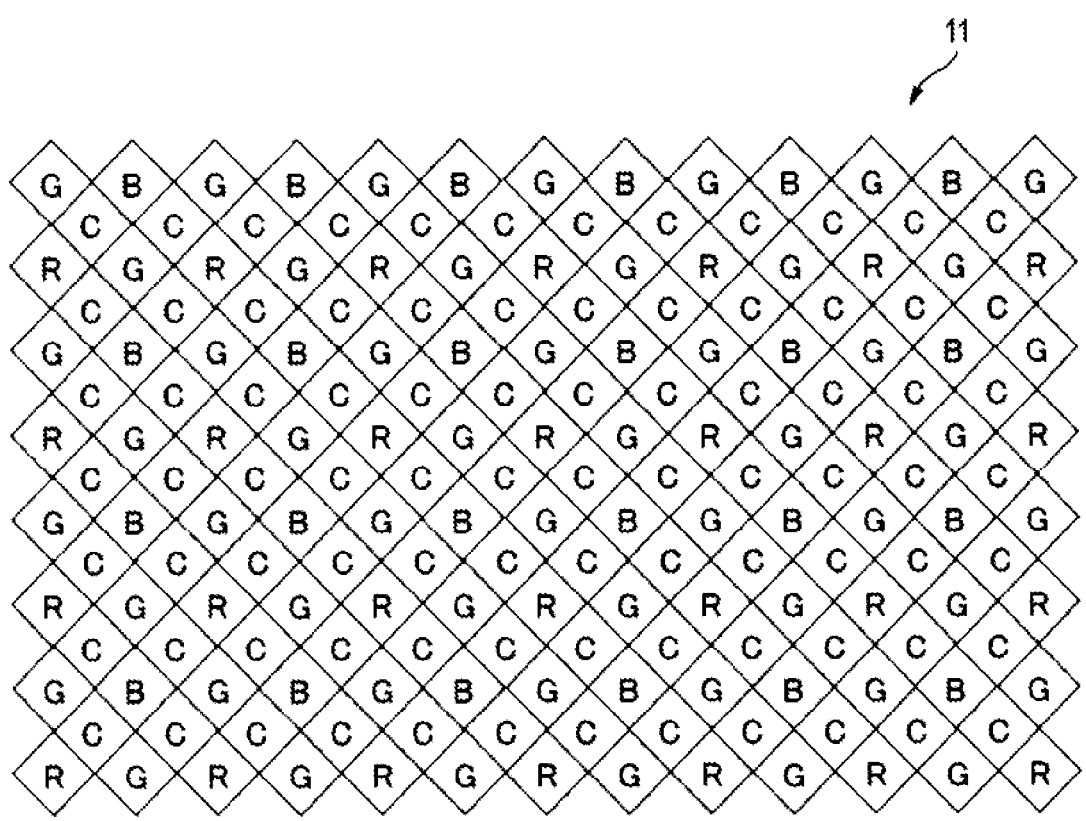
FIG. 3 shows a diagram schematically depicting an exemplary pixel arrangement of a pixel array part 11 according to the embodiment.

FIG. 3 shows a diagram schematically depicting an exemplary pixel arrangement of the pixel array part 11 according to the embodiment.

As shown in FIG. 3, the pixel array part 11 shown in FIG. 3 adopts an oblique pixel array, and is formed in a pixel arrangement in which the clear pixel C that has a high transmittance is inserted between a color filter pixel R having the peak of the spectral sensitivity characteristics in red, the color filter pixel G having the peak in green, and the color filter pixel B having the peak in blue, each including a color filter in the vertical and oblique directions uniformly, whereby the deviation of the resolution is removed.

In addition, the clear pixel C is not necessarily white.

In the pixel arrangement shown in FIG. 3, even numbered rows and even numbered columns including the zeroth row and the zeroth column are all configured of color filter pixels, and add numbered rows and add numbered columns are all configured of clear pixels C.

Figure 4:
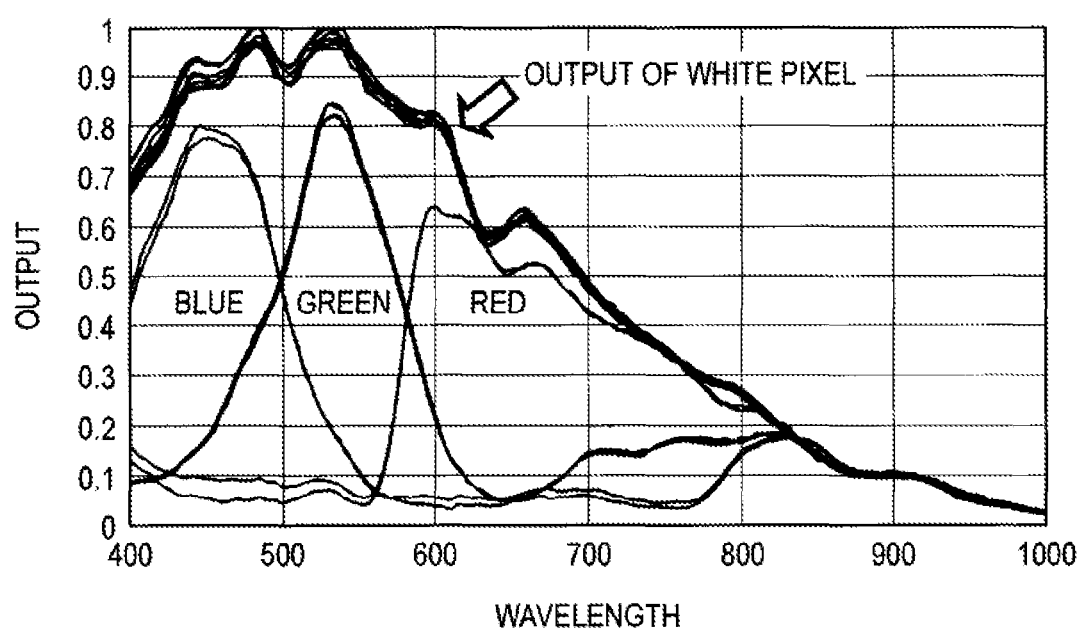
FIG. 4 shows a diagram conceptually depicting the spectral characteristics of color filter pixels R, G, and B and a clear pixel C.

FIG. 4 shows a diagram conceptually depicting the spectral characteristics of the color filter pixels R, G, and B and the clear pixel C.

In FIG. 4, the horizontal axis depicts the wavelength, and the vertical axis depicts the relative output.

As apparent from FIG. 4, the clear pixel C has sensitivity nearly throughout the visible light area (wavelengths of 360 nm to 700 nm). In other words, since the clear pixel C has a wide wavelength area component (including all the color signals), it is easy to provide color reproduction at the border of the clear pixel.

Hereinafter, the characteristic configuration of the pixel array part 11 will be described more in detail with reference to FIGS. 5 to 13.

Figure 5:
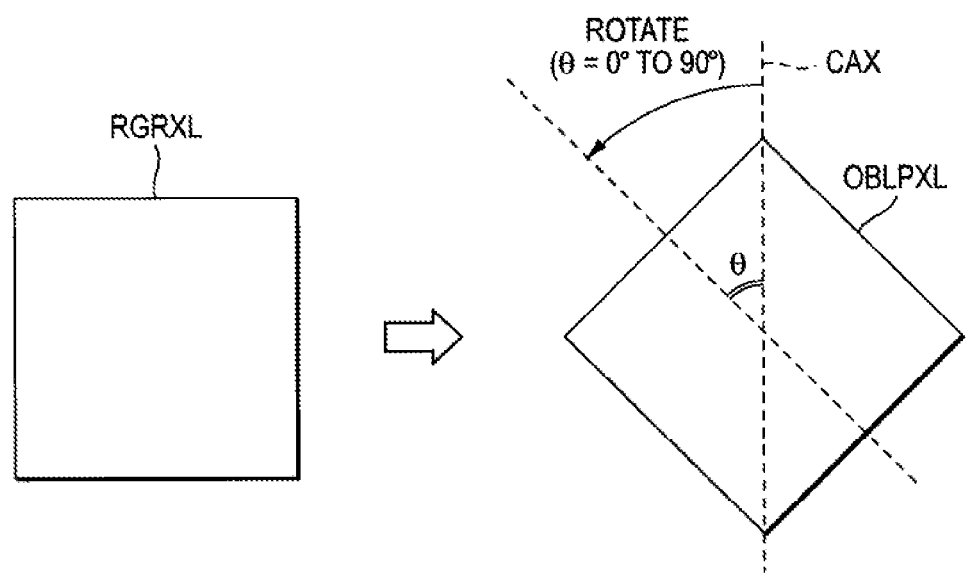
FIG. 5 shows a diagram illustrative of an oblique pixel array.

As shown in FIG. 5, in the pixel array part 11 according to the embodiment, a so-called rectangular unit pixel RGPXL is arranged in a so-called oblique pixel OBLPXL in which the unit pixel is rotated at a predetermined angle θ (θ=0° to 90°) about a column axis CAX.

Figure 6:
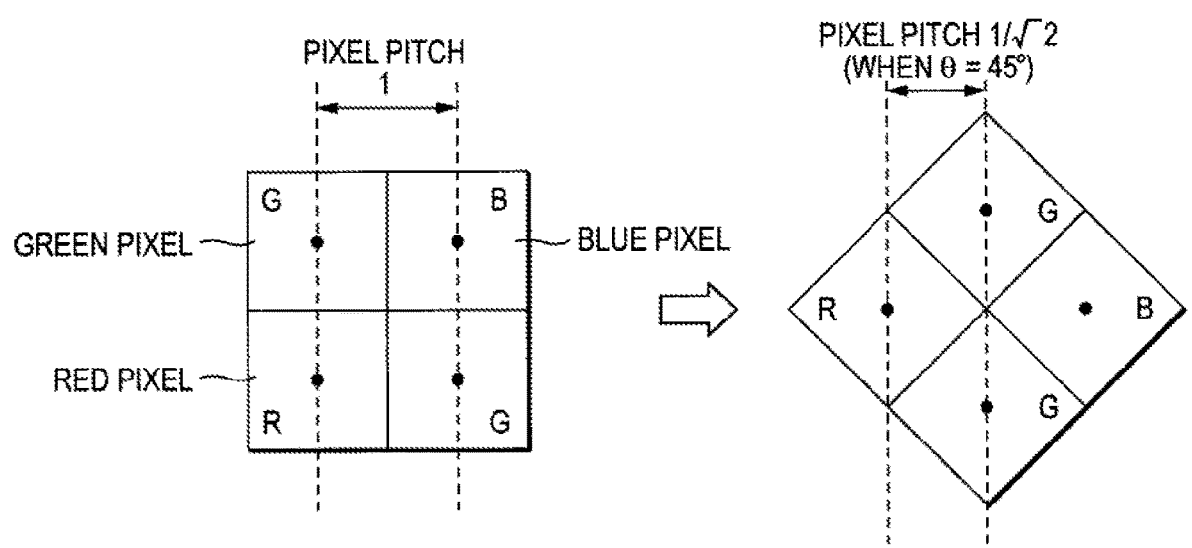
FIG. 6 shows a diagram illustrative of advantages to adopt the oblique pixel array.

An advantage that adopts the oblique pixel OBLPXL array will be described with reference to FIG. 6. In addition, in FIG. 6, the Bayer array is taken as an example.

The pixel pitch of the oblique pixel OBLPXL is 1/√2 when the turning angle θ is 45 degrees where the pixel pitch PTC of the rectangular pixel RGPXL is 1. Thus, the pixel pitch can be made smaller without changing the size of the pixel.

Figure 7:
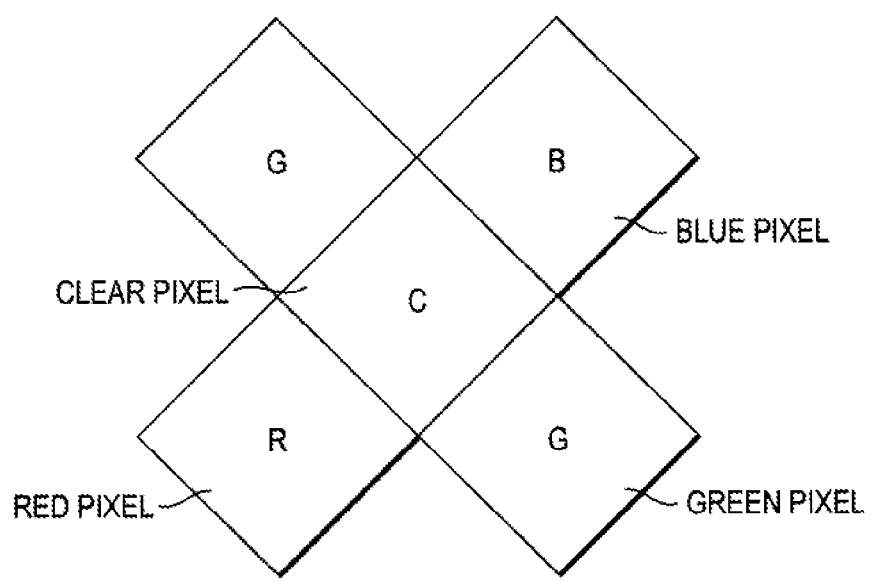
FIG. 7 shows a diagram depicting a basic oblique pixel array unit in which a clear pixel C is inserted in the middle of four color filter pixels R, G, G, and B in the Bayer array.

In the embodiment, as shown in FIG. 7, the clear pixel C is inserted in the middle of four color filter pixels R, G, G, and B in the Bayer array in the oblique pixel array to form the basic oblique pixel array unit.

The Bayer array is left to easily perform a color interpolation process for a signal processing system.

For the read mode of the pixel array part 11 having the configuration when it is driven, the clear pixel C and the color filter pixels (color pixels) R, G, and B are read by different channels.

Figure 8:
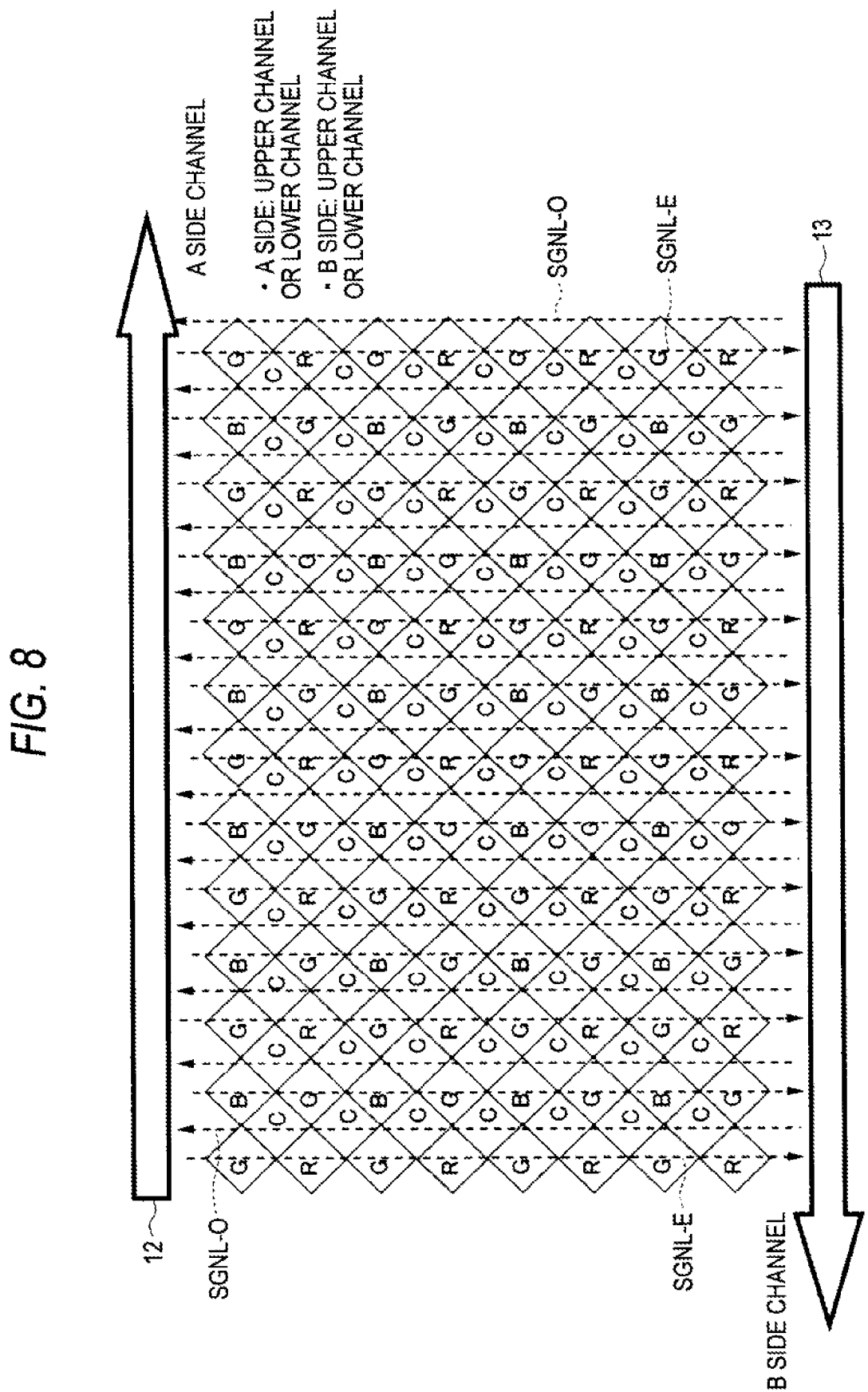
FIG. 8 shows a diagram illustrative of the read mode for the pixel array part when driven in the embodiment.

In the embodiment, for example, as shown in FIG. 8, a read channel CH-A exclusive for clear pixels and a read channel CH-B exclusive for color filter pixels are provided separately to read the clear pixel C and the color filter pixels R, G, and B independently.

In the example shown in FIG. 8, the clear pixel horizontal scanning circuit 12 is arranged as a read processing system for the channel CH-A on the upper side in the drawing, and the color filter pixel (color pixel) horizontal scanning circuit 13 is arranged as a read system for the channel CH-B in the lower side in the drawing.

In the embodiment, a signal line SGNL-O wired to the add numbered column is connected to the clear pixel horizontal scanning circuit 12, and a signal line SGNL-E wired to the even numbered column is connected to the color filter pixel (color pixel) horizontal scanning circuit 13.

In the embodiment, in addition to adopting the mode in which the clear pixel C and the color filter pixels (color pixels) R, G, and B are read by different channels, it is configured in which the time period, rate, and gain in processing in the subsequent stage of the electronic shutter (rolling shutter) are separately changed between the clear pixel C and the color filter pixels (color pixels) R, G, and B.

Figure 9:
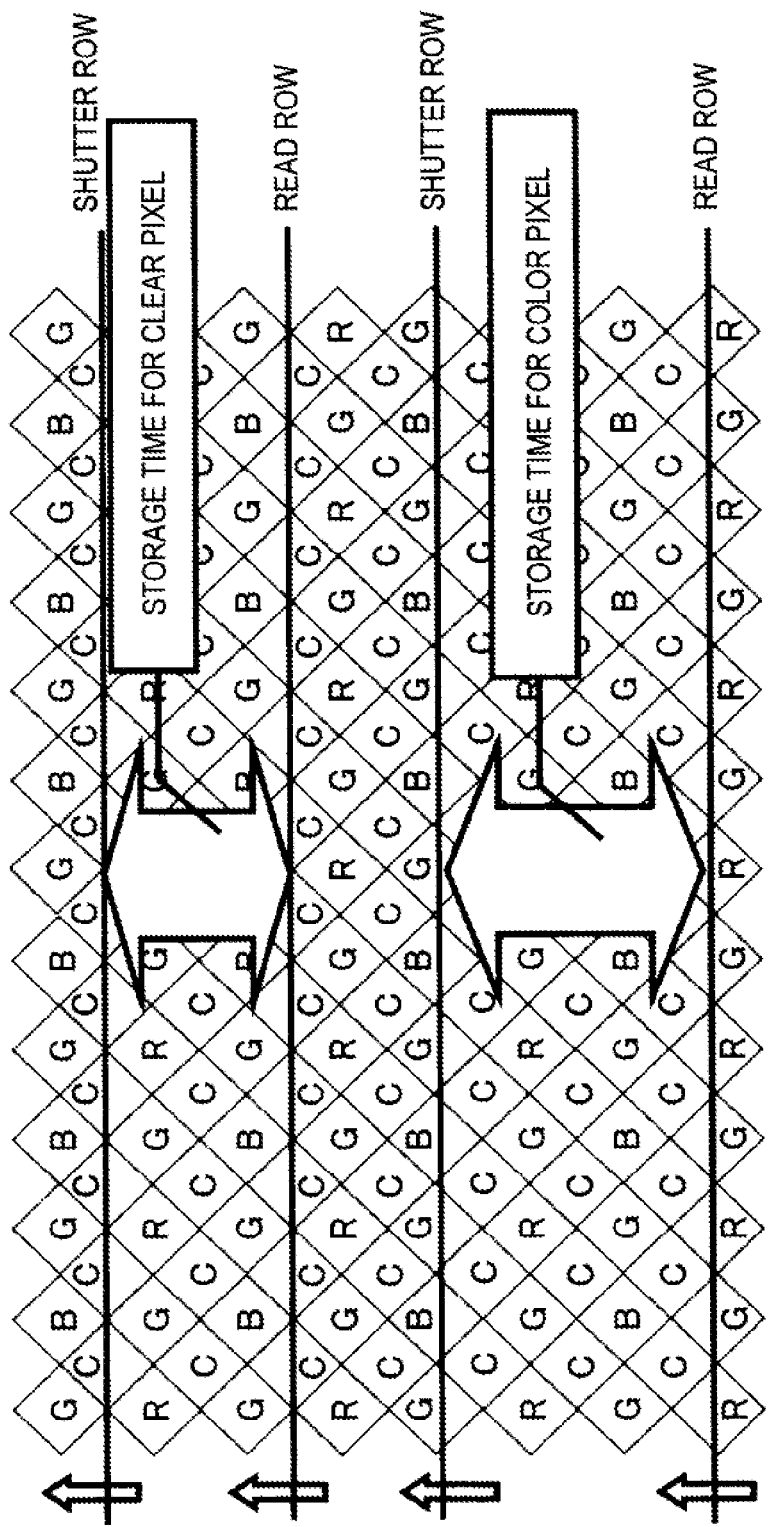
FIG. 9 shows a diagram schematically depicting the drive mode for an electronic shutter in the embodiment.

FIG. 9 shows a diagram schematically depicting the drive mode of the electronic shutter in the embodiment.

In the embodiment, as shown in FIG. 9, the pixels can be read by varying the time for the rolling shutter between the storage time for the clear pixel and the color pixel.

In addition, the shutter speed may be varied separately between the clear pixel and the color filter pixels (color pixels) R, G, and B.

For example, at a bright place, the shutter for the clear pixel is released quickly to prevent the saturation of the clear pixel, whereas at a dark place, in reverse, the shutter for the clear pixel is released slowly to increase sensitivity.

With this configuration, color information is increased at a bright place, and color information is decreased at a dark place, whereby natural color can be created.

In the embodiment, in order to implement high speed read, a so-called adding read scheme is adopted.

Figure 10:
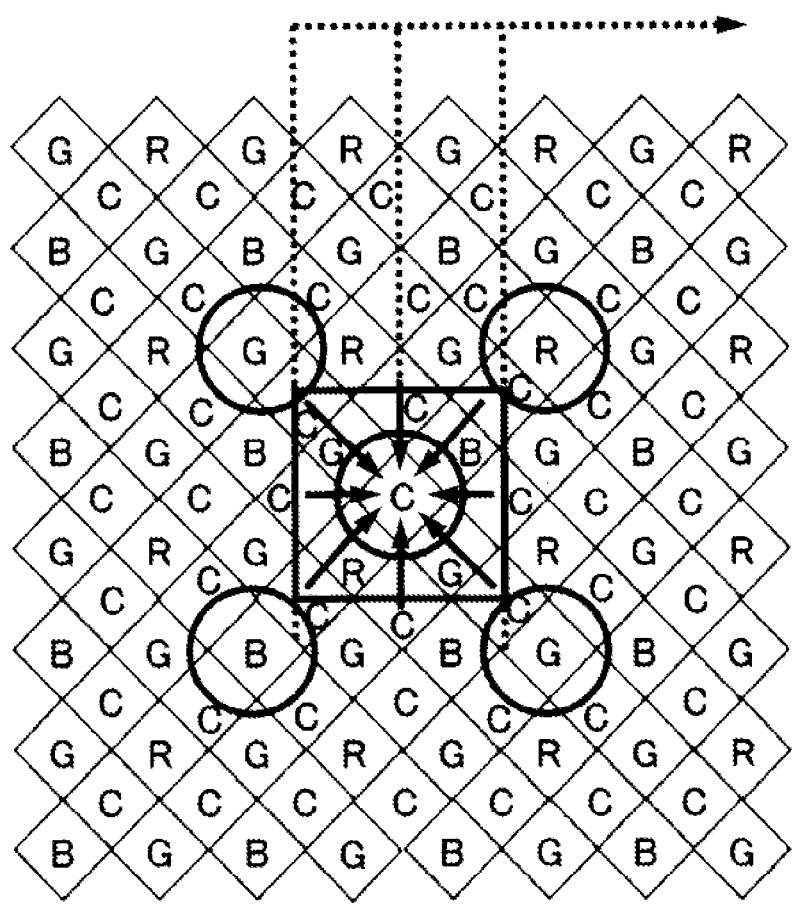
FIG. 10 shows a diagram illustrative of a read scheme of the clear pixel C in a read channel CH-A, in which nine pixels are added and read.

FIG. 10 shows a diagram illustrative of the read scheme of the clear pixel C in the read channel CH-A, in which nine pixels are added and read.

Figure 11:
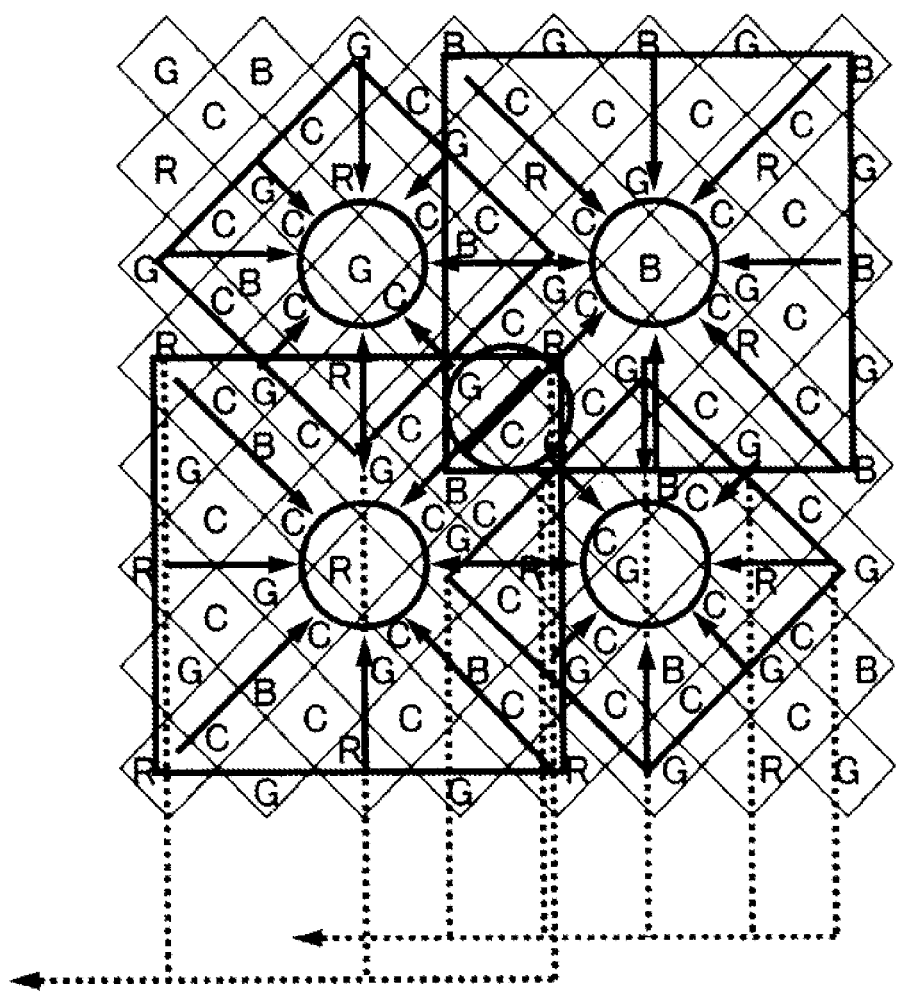
FIG. 11 shows a diagram illustrative of the read scheme of the color filter pixels (color pixels) R, G, and B in the read channel CH-B, in which nine pixels are added and read.

FIG. 11 shows a diagram illustrative of the read scheme of the color filter pixels (color pixels) R, G, and B in the read channel CH-B, in which nine pixels are added and read.

As shown in FIGS. 10 and 11, nine pixels are added, whereby the interpolation process can be easily performed without losing the arrangement in which the clear pixel C is arranged in the middle of the Bayer array.

Figure 12:
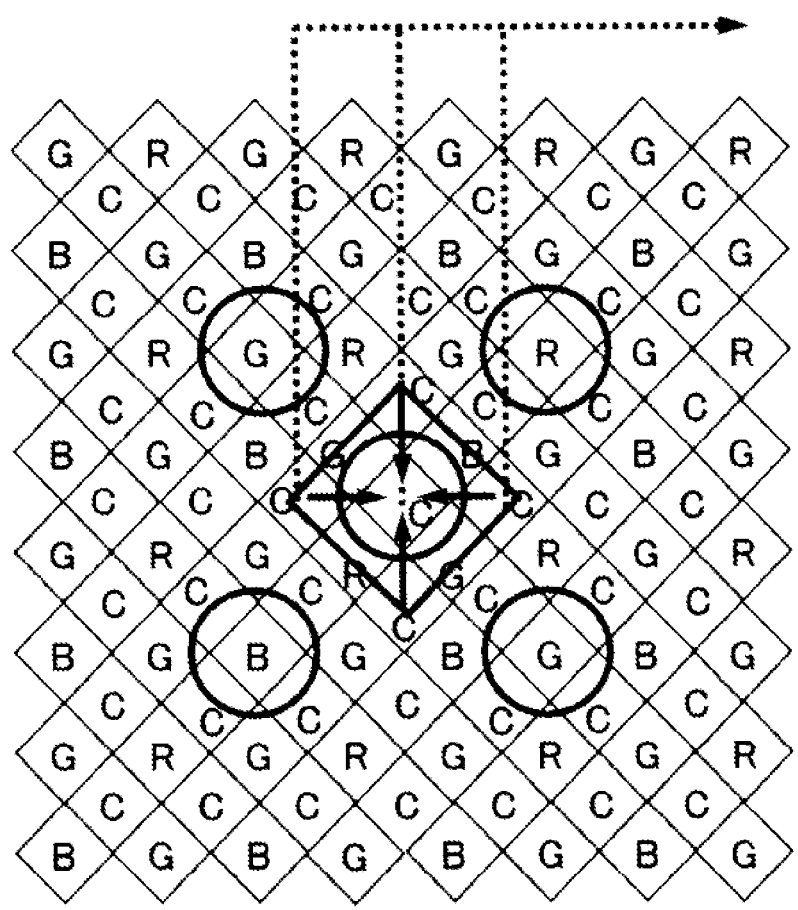
FIG. 12 shows a diagram illustrative of the read scheme of the clear pixel C in the read channel CH-A, in which five pixels are added and read.

FIG. 12 shows a diagram illustrative of the read scheme of the clear pixel C in the read channel CH-A, in which five pixels are added and read.

Figure 13:
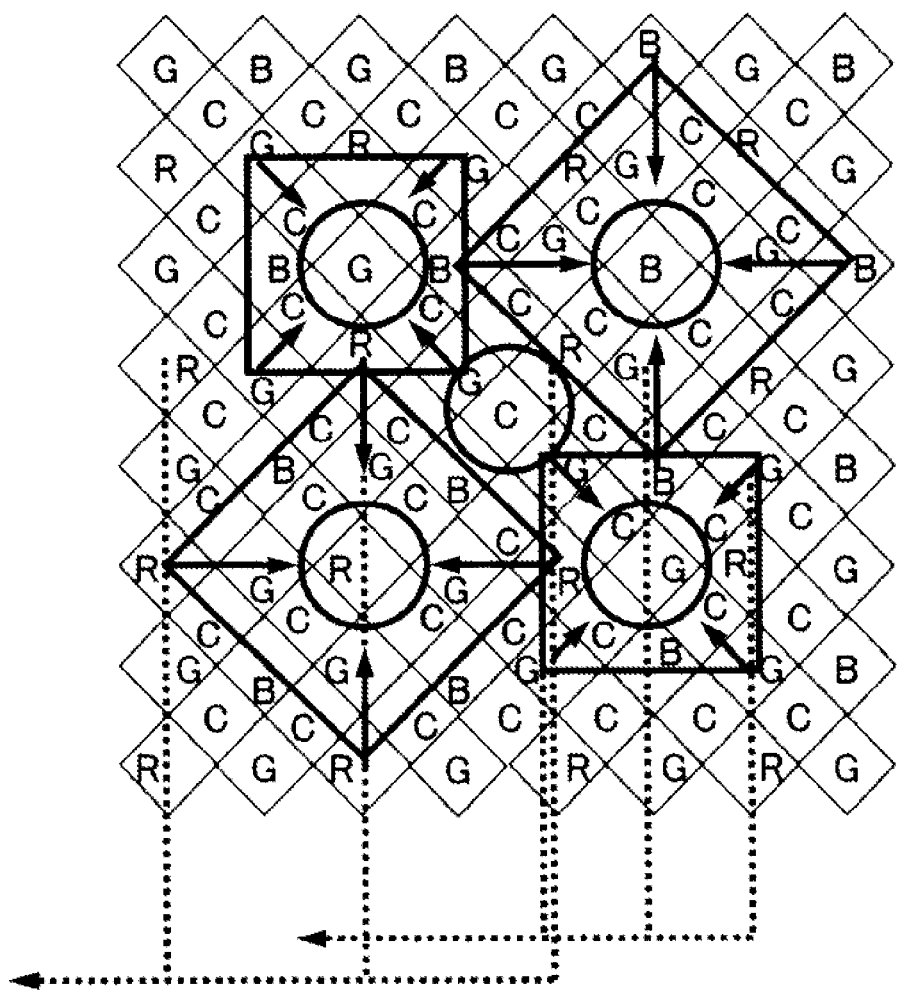
FIG. 13 shows a diagram illustrative of the read scheme of the color filter pixels (color pixels) R, G, and B in the read channel CH-B, in which five pixels are added and read.

FIG. 13 shows a diagram illustrative of the read scheme of the color filter pixels (color pixels) R, G, and B in the read channel CH-B, in which five pixels are added and read.

As shown in FIGS. 12 and 13, also in the case of adding five pixels, the pixels at closer positions are added in the case of adding nine pixels, whereby color reproducibility is improved without losing the arrangement in which the clear pixel C is arranged in the middle of the Bayer array.

From the view point of the read rate, adding nine pixels is advantageous.

As described above, the read signal of the clear pixel C read in accordance with the adding read scheme is forwarded to the clear pixel AFE 17 through the horizontal scanning circuit 12.

In addition, the read signal of the color filter pixels (color pixels) R, G, and B is forwarded to the clear pixel AFE 18 through the horizontal scanning circuit 13.

In the AFEs 17 and 18, the read signal is processed into analog form such as amplification, and converted to a digital signal, and then forwarded to a signal processing part in the subsequent stage.

Figure 14:
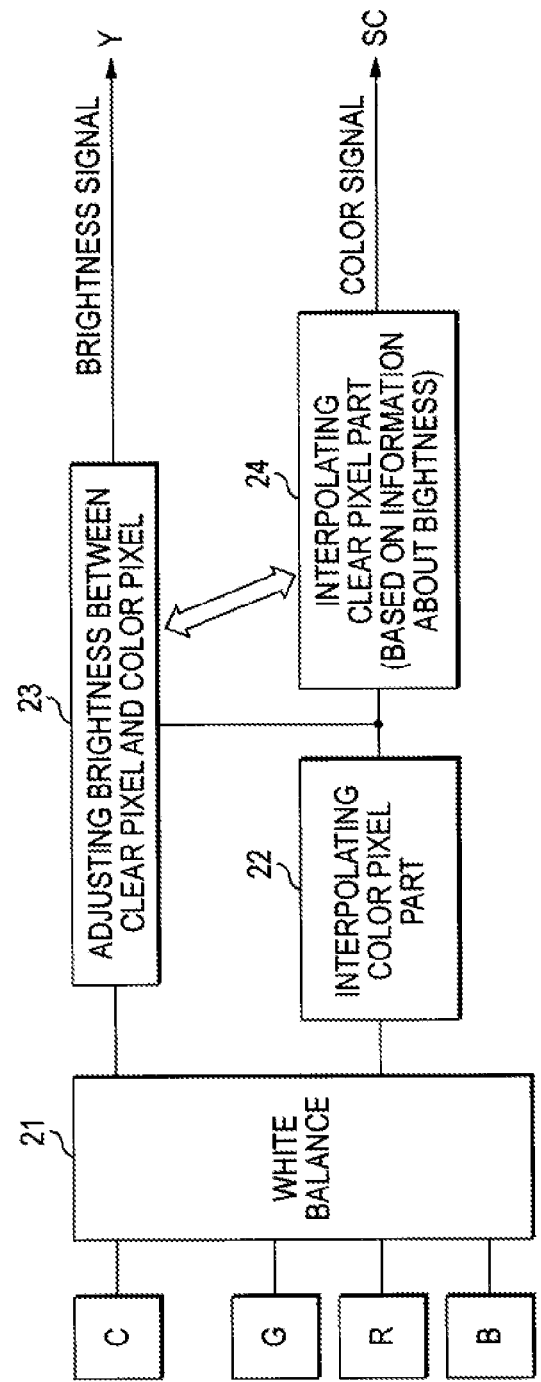
FIG. 14 shows a block diagram depicting an exemplary configuration of a signal processing part in the subsequent stage according to the embodiment.

FIG. 14 shows a block diagram depicting an exemplary configuration of a subsequent signal processing part according to the embodiment.

As shown in FIG. 14, a signal processing part 20 has a white balance adjusting part 21, a color pixel interpolating part 22, a brightness adjusting part 23, and a clear pixel interpolating part 24.

The white balance adjusting part 21 adjusts white balance based on the signals of the clear pixel C and the color filter pixels (color pixels) R, G, and B forwarded from the AFEs 17 and 18.

Figure 15:
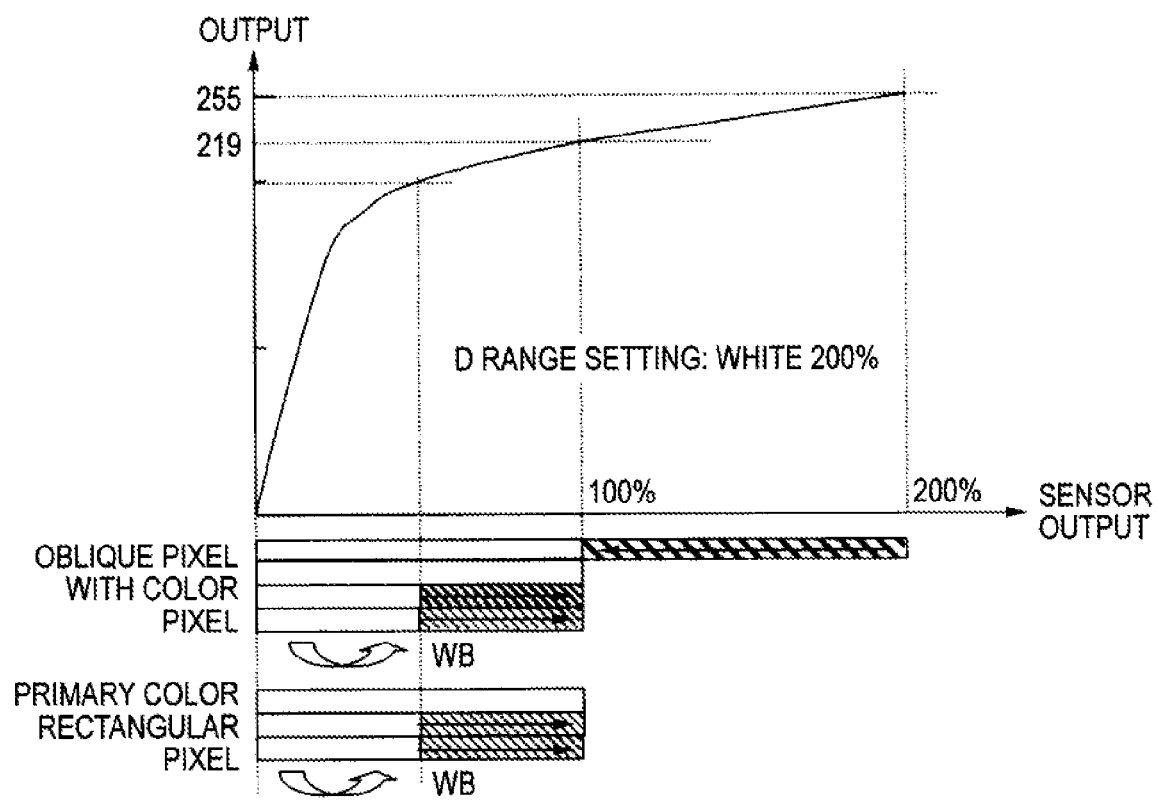
FIG. 15 shows a diagram illustrative of a white balance control process at bright places in the embodiment.

FIG. 15 shows a diagram illustrative of the white balance control process at bright places in the embodiment.

Figure 16:
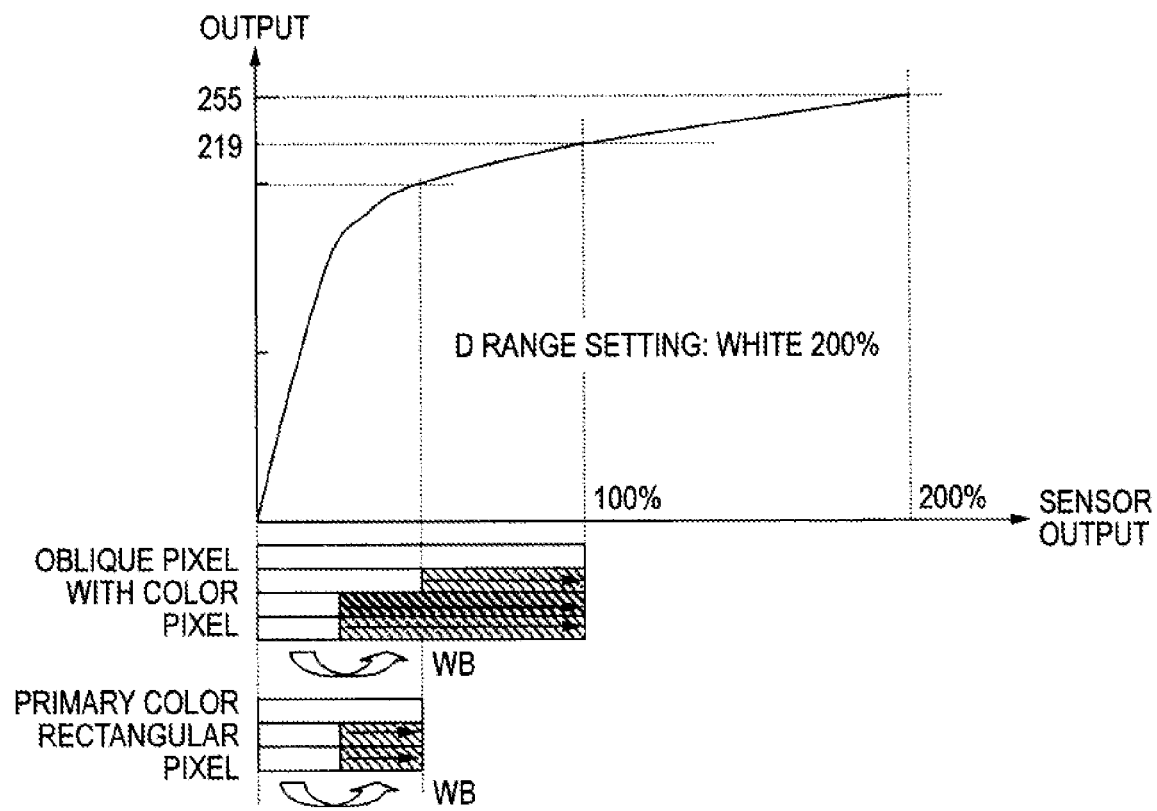
FIG. 16 shows a diagram illustrative of the white balance control process at dark places in the embodiment.

FIG. 16 shows a diagram illustrative of the white balance control process at dark places in the embodiment.

At bright places, the white balance adjusting part 21 adjusts the signals of the clear pixel C and the other color filter pixels (color pixels) R and B on the basis of the signal of the color filter pixel (color pixel) G.

On the other hand, at dark places, the white balance adjusting part 21 adjusts the signals of the color filter pixels (color pixels) R, G, and B on the basis of the signal of the clear pixel C.

The interpolating part 22 performs the interpolation process only for the color filter pixel (color pixel) part after white balance is adjusted.

The brightness adjusting part 23 adjusts the brightness signals of the color filter pixels (color pixels) R, G, and B and the brightness signal of the clear pixel C to output a brightness signal Y.

The interpolating part 24 performs the interpolation process for the white pixel based on the brightness signal to output a color signal SC.

As described above, the configuration and function of each part of the imaging device 10 according to the embodiment have been described.

Next, the structure of the pixel array part will be described.

Figure 17:
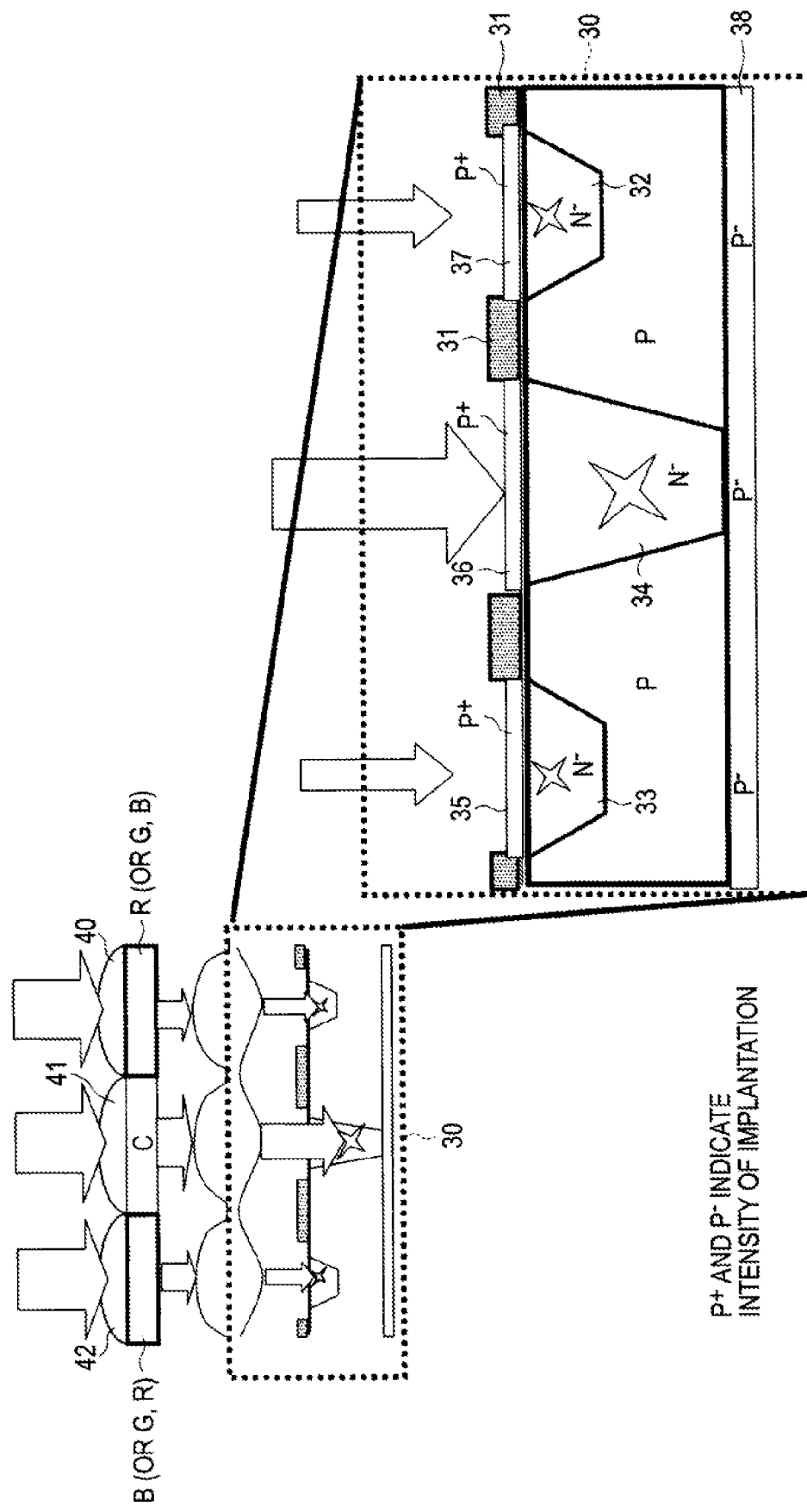
FIG. 17 shows a diagram simply depicting a partial cross section of the pixel array part according to the embodiment.

FIG. 17 shows a diagram simply depicting a partial cross section of the pixel array part according to the embodiment.

In FIG. 17, 30 denotes a semiconductor substrate, 31 denotes device separation areas, and 40 to 42 denote microlenses.

On the semiconductor substrate 30, N-sensor areas 32 and 33 of the color filter pixel (color pixel) and an N-sensor area 34 of the clear pixel are formed between the device separation areas 31.

In addition, 35 to 37 denote a P+ layer, and 38 denotes a P− layer.

In the embodiment, N− ions are implanted deep only in the N-sensor area 34 of the clear pixel into the N-sensor areas 32 and 33 of the color filter pixel (color pixel) to increase the sensitivity on the high wavelength side. For example, it is configured to sense the wavelength area of near infrared rays.

Figure 18:
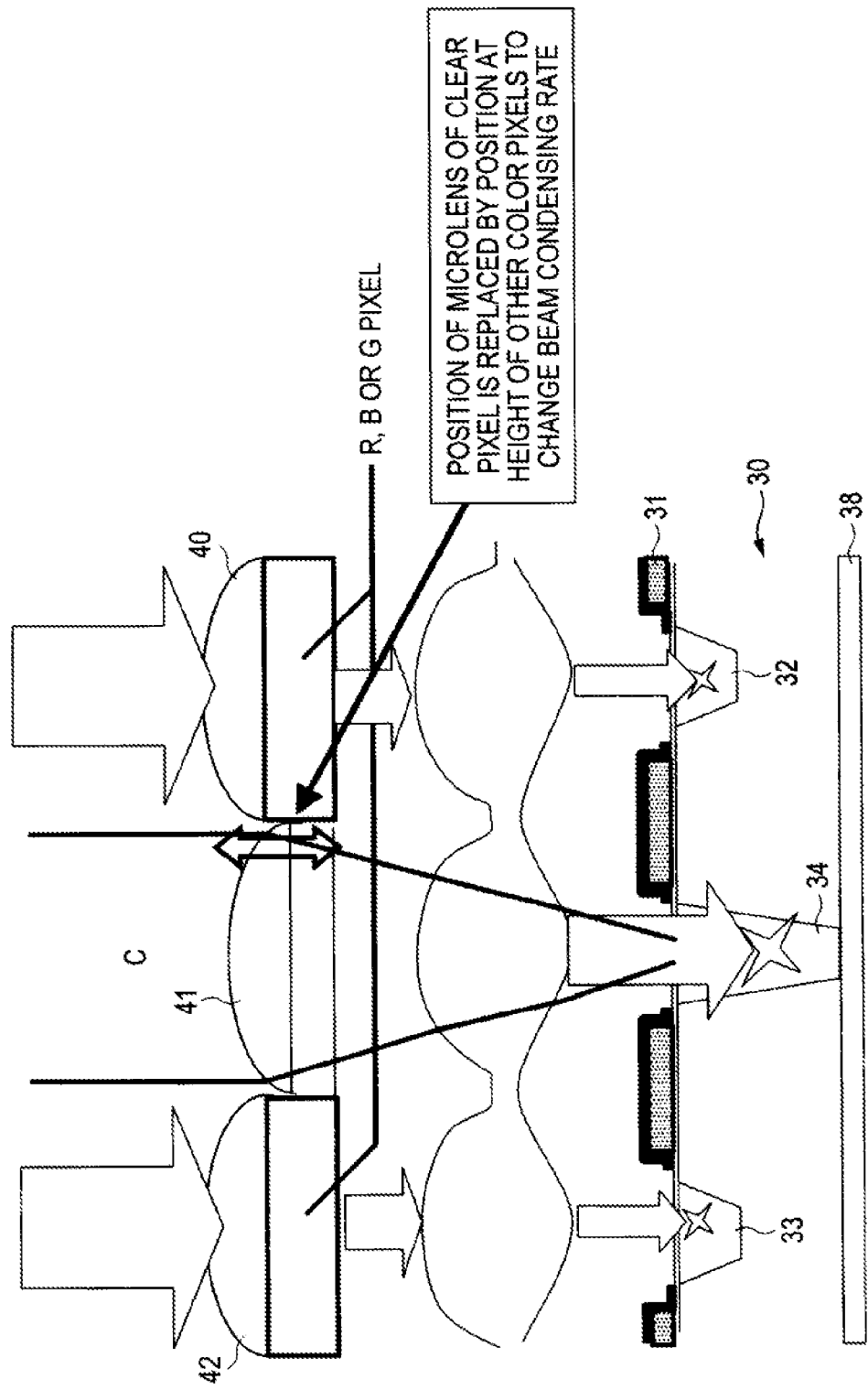
FIG. 18 shows a diagram simply depicting a partial cross section of another exemplary configuration of the pixel array part according to the embodiment.

FIG. 18 shows a diagram simply depicting a partial cross section of another exemplary configuration of the pixel array part according to the embodiment.

The pixel array part shown in FIG. 18 is configured in which the position of the microlens 41 of the clear pixel C is varied from the height position of the other color filter pixels (color pixels) for adjustment.

Accordingly, the beam condensing rate can be increased.

As described above, according to the embodiment, the pixel array part 11 adopts the oblique pixel array, and is formed in a pixel arrangement in which the clear pixel C that has a high transmittance is uniformly inserted in the vertical and oblique directions between a color filter pixel R having the peak of the spectral sensitivity characteristics in red, the color filter pixel G having the peak in green, and the color filter pixel B having the peak in blue, each including a color filter, whereby the deviation of the resolution is removed. It is configured in which the read channel CH-A exclusive for clear pixels and the read channel CH-B exclusive for color filter pixels are provided separately, and the clear pixel C and the color filter pixels R, G, and B are read separately. In addition to adopting the scheme to read the clear pixel C and the color filter pixels (color pixels) R, G, and B by the different channels, and the time period, rate, and gain in processing in the subsequent stage of the electronic shutter (rolling shutter) are changed separately for the clear pixel C and the color filter pixels (color pixels) R, G, and B. Therefore, the following advantage can be obtained.

For example, the pixel is rotated at an angle of 45 degrees to make the pixel pitch to 1/√2, and to increase the resolution. The area can be doubled as compared with the case in which a typical pixel array has the same pitch, sensitivity can be increased, and a clear (transparent) pixel is inserted into the color coating of the oblique pixel array to further improve the sensitivity.

In addition, when the clear pixel is arranged in the middle of the Bayer array, the color interpolation process is facilitated.

In addition, the shutter time and gain can be changed separately between the clear pixel C and the color filter pixels (color pixels) R, B and G. Therefore, the output of the clear pixel is made moderate at a bright place, whereas the output is increased at a dark place, whereby a more natural picture can be created as though a real one is seen by eyes.

As described above, the improved sensitivity is intended to enhance the signal-to-noise ratio, and high speed read with low intensity can be implemented due to the improved sensitivity.

In high speed read, for example, nine pixels are added to provide the same arrangement after addition, whereby an advantage is exerted that signal processing in color production is facilitated.

In addition, in the discussion above, an example has been described in which the pixel array part 11 adopts the oblique pixel array as shown in FIG. 3, and is formed in the pixel arrangement in which the clear pixel C having a high transmittance is inserted between the color filter pixel R having the peak of the spectral sensitivity characteristics in red, the color filter pixel G having the peak in green, and the color filter pixel B having the peak in blue each including a color filter in the vertical and oblique directions, whereby the deviation of the resolution is eliminated.

However, an embodiment of the invention is not limited to the pixel arrangement shown in FIG. 3, which can adopt various forms as a pixel arrangement into which the clear pixel is inserted, and can obtain the same advantages as described above.

Hereinafter, anther exemplary configuration of the pixel arrangement will be described.

Figure 19:
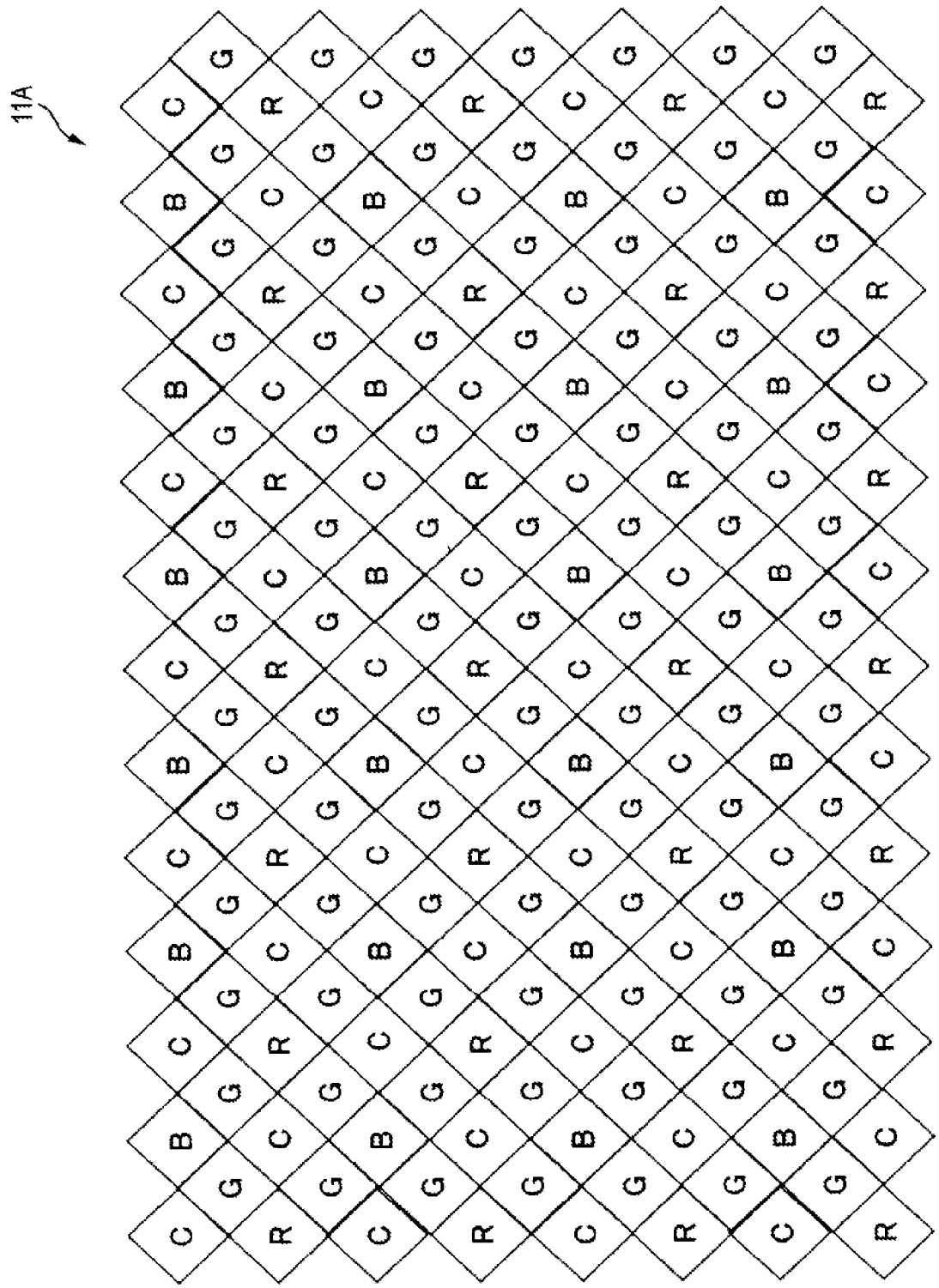
FIG. 19 shows a diagram depicting a second exemplary pixel arrangement of the pixel array part according to the embodiment.

FIG. 19 shows a diagram depicting a second exemplary pixel arrangement of the pixel array part according to the embodiment.

In the pixel arrangement of a pixel array part 11A shown in FIG. 19, a clear pixel C is arranged at the position at which the color filter (color pixel) G in the pixel arrangement shown in FIG. 3, and a color filter (color pixel) G is arranged at the position at which the clear pixel C shown in FIG. 3 is arranged.

In the pixel arrangement shown in FIG. 19, in the even numbered rows including the zeroth row, the color filter pixel B and the clear pixel C are arranged alternately in a single pixel, in the even numbered columns including the zeroth column, the color filter pixel R and the clear pixel C are arranged alternately in a single pixel, and the add numbered row and the add numbered column are formed only of the color filter pixel G.

Also in the case of adopting the pixel array, the read channel CH-A exclusive for clear pixels and the read channel CH-B exclusive for color filter pixels are provided separately, and the clear pixel C and the color filter pixel R, G, B are read separately. In addition to adopting the scheme to read the clear pixel C and the color filter pixels (color pixels) R, G, and B by the different channels, it is configured in which the time period, rate, and gain in processing at the subsequent stage of the electronic shutter (rolling shutter) are changed separately for the clear pixel C and the color filter pixels (color pixels) R, G, and B.

However, the clear pixel C and the color filter pixel R or B are mixed in the same row, which causes the necessity of arranging a wiring for the color filter pixel (color pixel) and a wiring for the clear pixel C.

Figure 20:
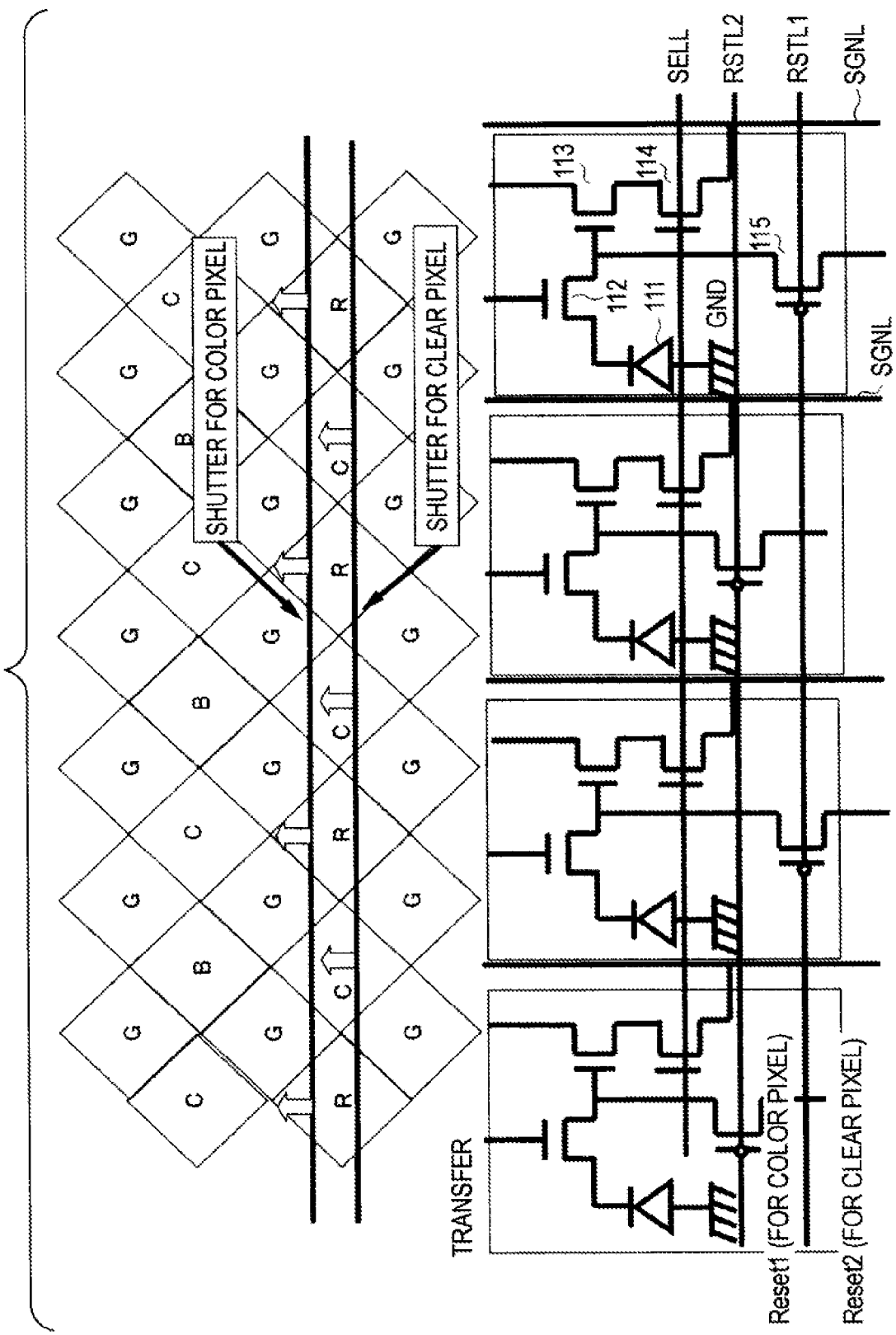
FIG. 20 shows a diagram depicting an exemplary configuration of in which the clear pixels and color filter pixels are mixed in the same row in the oblique pixel array.

FIG. 20 shows a diagram depicting an exemplary configuration in which the clear pixel and the color filter pixel are mixed in the same row.

In this case, as shown in FIG. 20, a shutter wiring and a clear pixel wiring for the color filter pixel (color pixel) are wired in a single row. More specifically, a color pixel reset wiring RSTL1 and a clear pixel reset wiring RSTL2 are wired.

The configuration of the unit pixel is the same as that in FIG. 2, omitting the detailed description.

Figure 21:
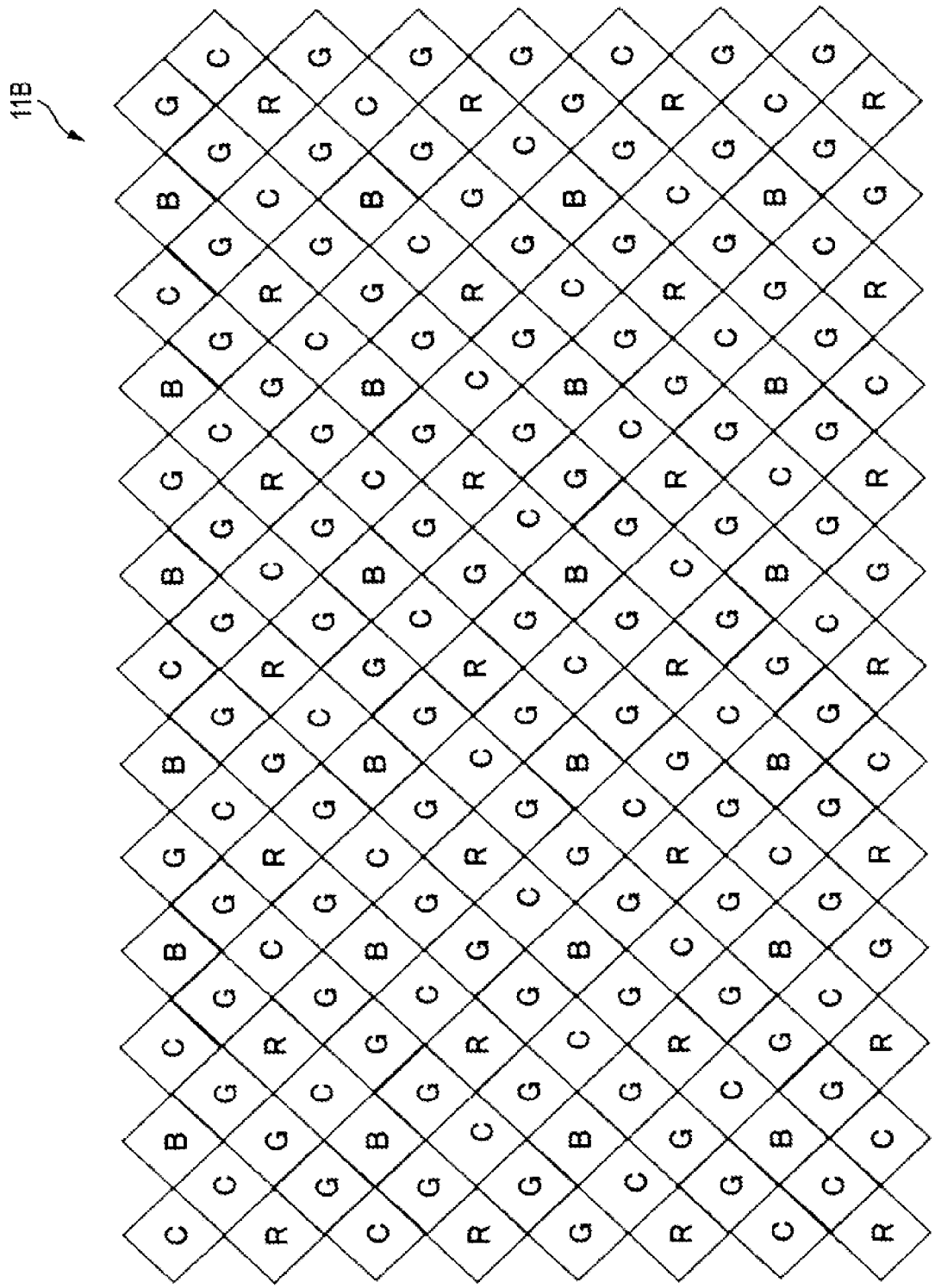
FIG. 21 shows a diagram depicting a third exemplary pixel arrangement of the pixel array part according to the embodiment.

FIG. 21 shows a diagram depicting a third exemplary pixel arrangement of the pixel array part according to the embodiment.

The pixel arrangement of a pixel array part 11B shown in FIG. 21 is an arrangement in which the clear pixel is included in all the rows and columns.

In the pixel arrangement, the clear pixel is arranged at intervals, but also in this case, the configuration similar to that in FIG. 20 is adopted, whereby the shutter can be released separately from the portions of the color pixel, and the clear pixel can be read separately.

Figure 22:
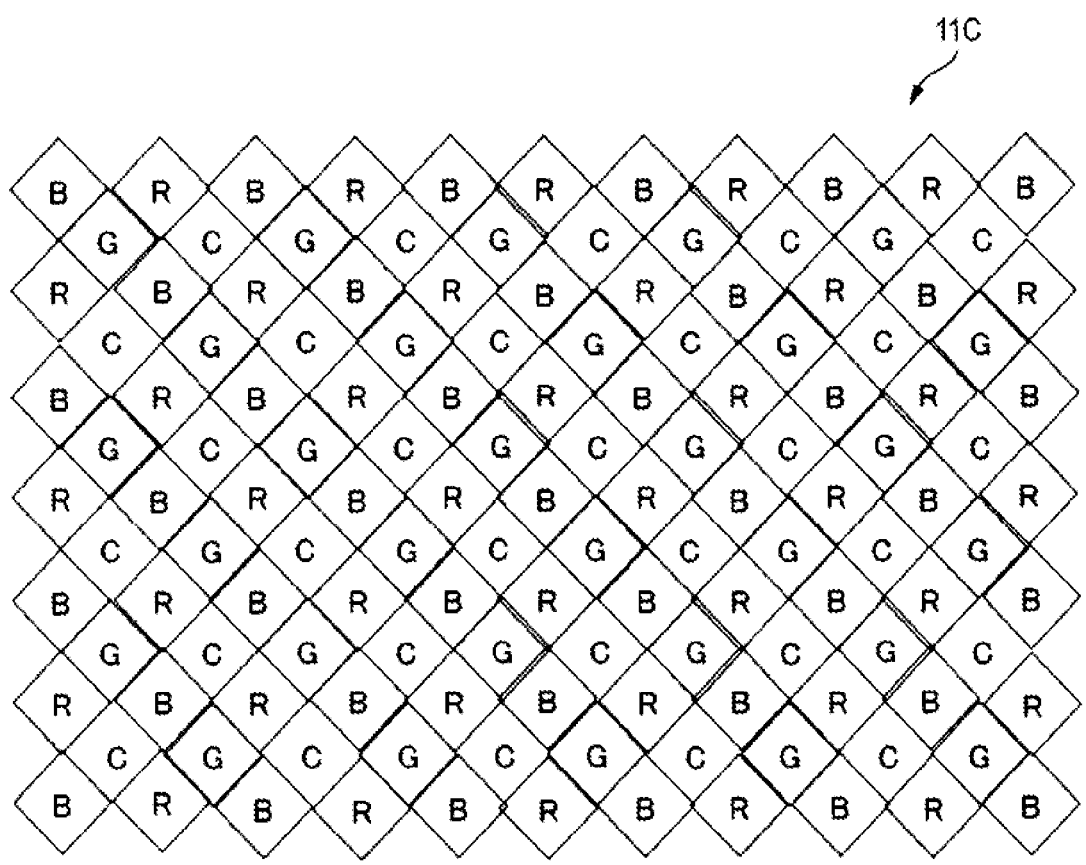
FIG. 22 shows a diagram depicting a fourth exemplary pixel arrangement of the pixel array part according to the embodiment.

FIG. 22 shows a diagram depicting a fourth exemplary pixel arrangement of the pixel array part according to the embodiment.

The pixel arrangement of a pixel array part 11C shown in FIG. 22 is an arrangement in which the clear pixel is included in each row and each column except the zeroth row and the zeroth column.

Also in the pixel arrangement, the clear pixel is arranged at intervals, but also in this case, the configuration similar to that in FIG. 20 is adopted, whereby the shutter can be released separately from the portions of the color pixel, and the clear pixel can be read separately.

Figure 23:
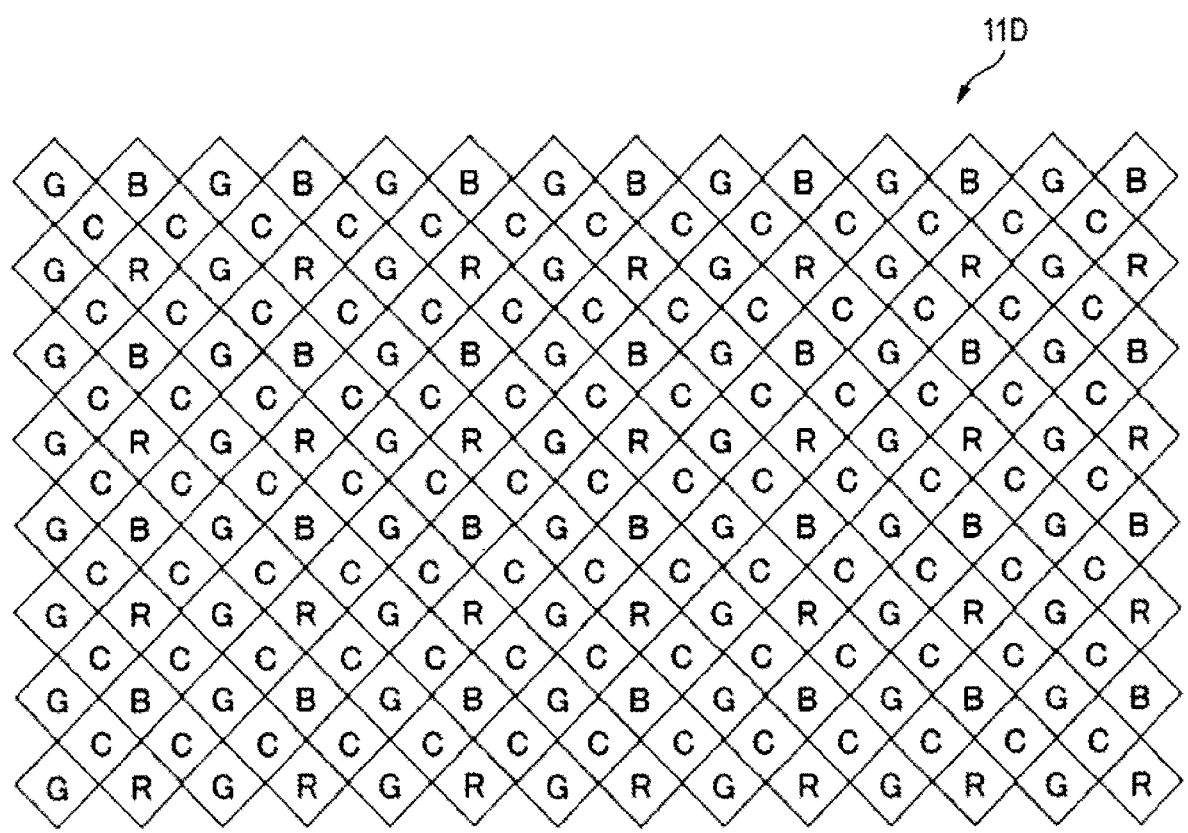
FIG. 23 shows a diagram depicting a fifth exemplary pixel arrangement of the pixel array part according to the embodiment.

FIG. 23 shows a diagram depicting a fifth exemplary pixel arrangement of the pixel array part according to the embodiment.

The pixel arrangement of a pixel array part 11D shown in FIG. 23 is an arrangement in which the position of arranging the color filter (color pixel) G in the add numbered row of the pixel arrangement shown in FIG. 3 is replaced by the color filter (color pixel) R.

In the pixel arrangement shown in FIG. 23, as similar to the array shown in FIG. 3, the add numbered row and the add numbered column are configured of only the clear pixel C.

In the pixel arrangement shown in FIG. 23, the pixel column of only the color filter (color pixel) G, the pixel column of the clear pixel C, the pixel column of the color filters (color pixels) R and B mixed are in turn arranged from the zeroth column, and the combination is repeated.

Also in the pixel arrangement, the shutter can be released separately from the portions of the color pixel, and the clear pixel can be read separately.

Figure 24:
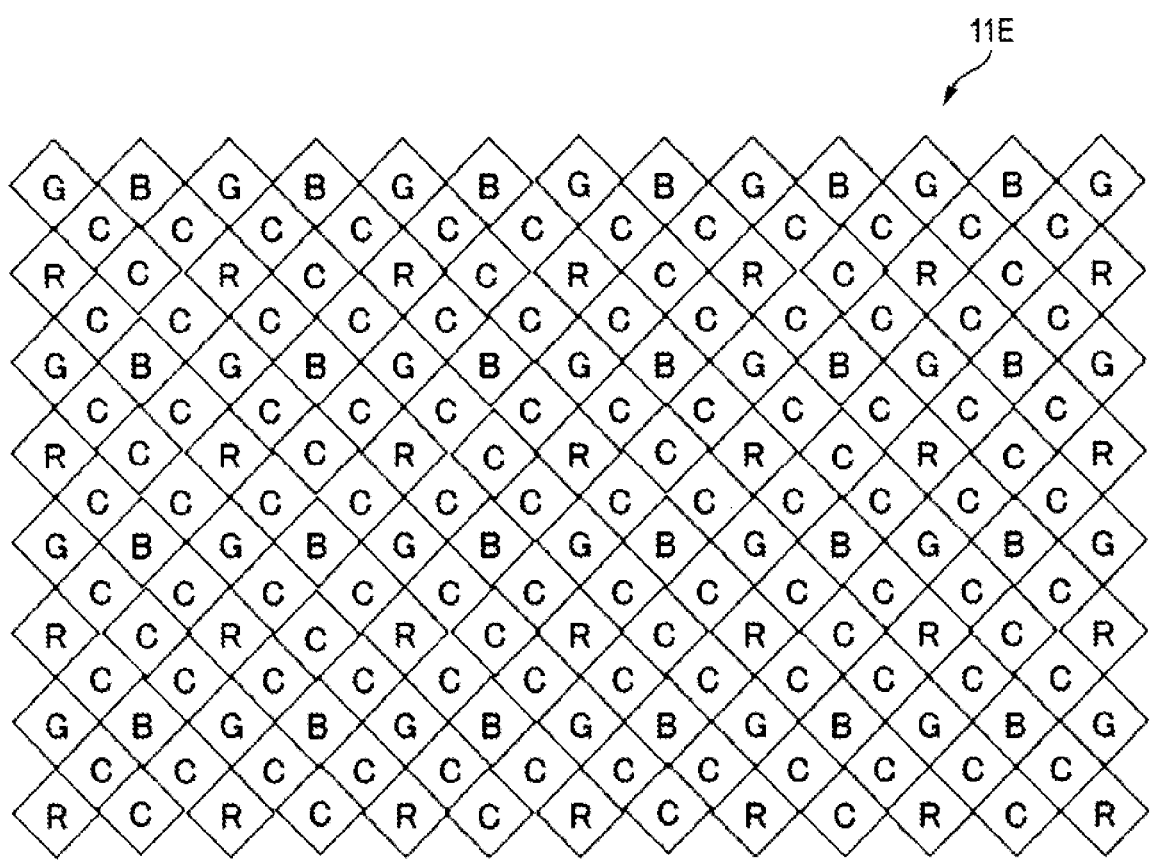
FIG. 24 shows a diagram depicting a sixth exemplary pixel arrangement of the pixel array part according to the embodiment.

FIG. 24 shows a diagram depicting a sixth exemplary pixel arrangement of the pixel array part according to the embodiment.

The pixel arrangement of a pixel array part 11E shown in FIG. 24 is an arrangement in which the clear pixel C is arranged at the position of arranging the color filter (color pixel) G at the third, seventh, eleventh and fifteenth rows in the add numbered rows of the pixel arrangement shown in FIG. 3 to increase the clear pixel, intending that the sensitivity is more improved.

Also in the pixel arrangement, the shutter can be released separately from the portions of the color pixel, and the clear pixel can be read separately.

Figure 25:
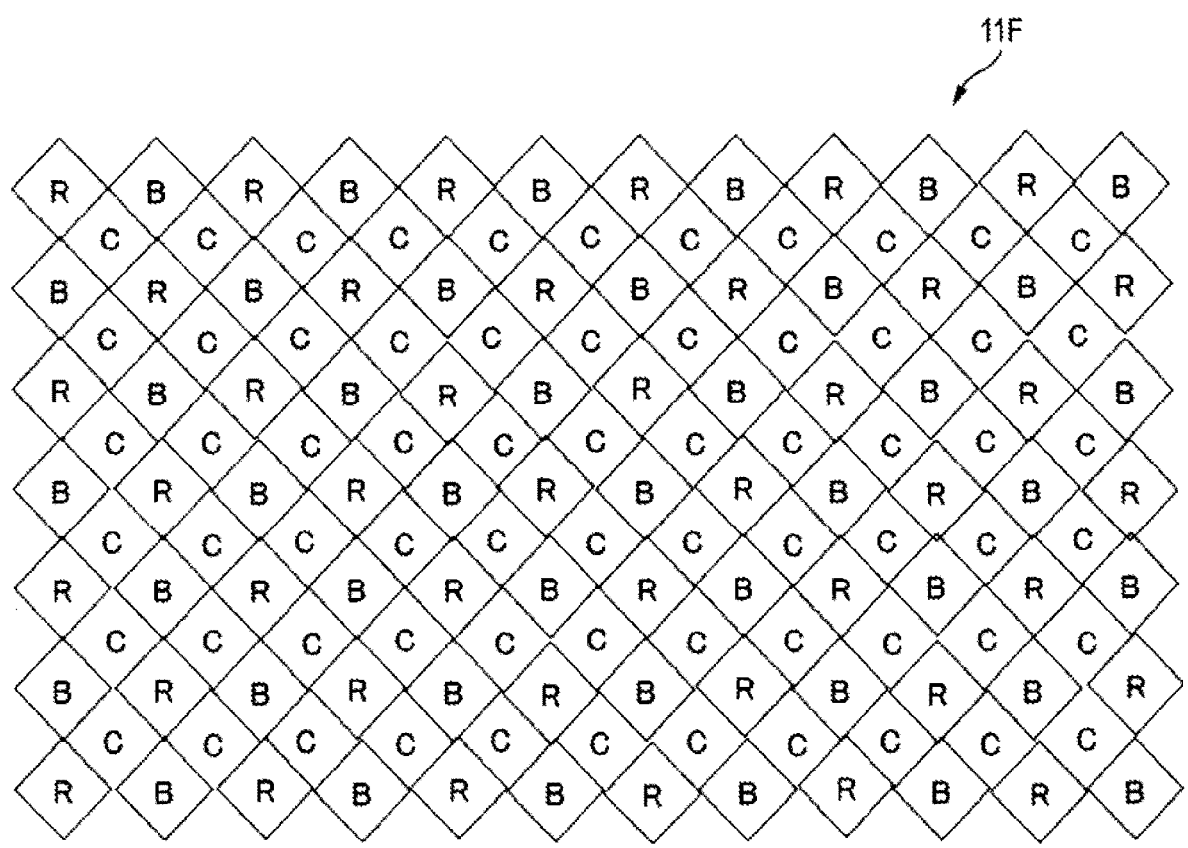
FIG. 25 shows a diagram depicting a seventh exemplary pixel arrangement of the pixel array part according to the embodiment.

FIG. 25 shows a diagram depicting a seventh exemplary pixel arrangement of the pixel array part according to the embodiment.

The pixel arrangement of a pixel array part 11F shown in FIG. 25 is an arrangement in which the color filter pixel (color pixel) G is removed, and in the even numbered rows and the even numbered columns including the zeroth row and the zeroth column, the pixel rows and the pixel columns are formed to have the color filter pixels (color pixels) R and B alternately arranged.

In this case, information about the color signal is formed based on information about the clear pixel and/or information about the color filters (color pixels) R and B having the spectral characteristics shown in FIG. 4.

Also in the pixel arrangement, the shutter can be released separately from the portions of the color pixel, and the clear pixel can be read separately.

Figure 26:
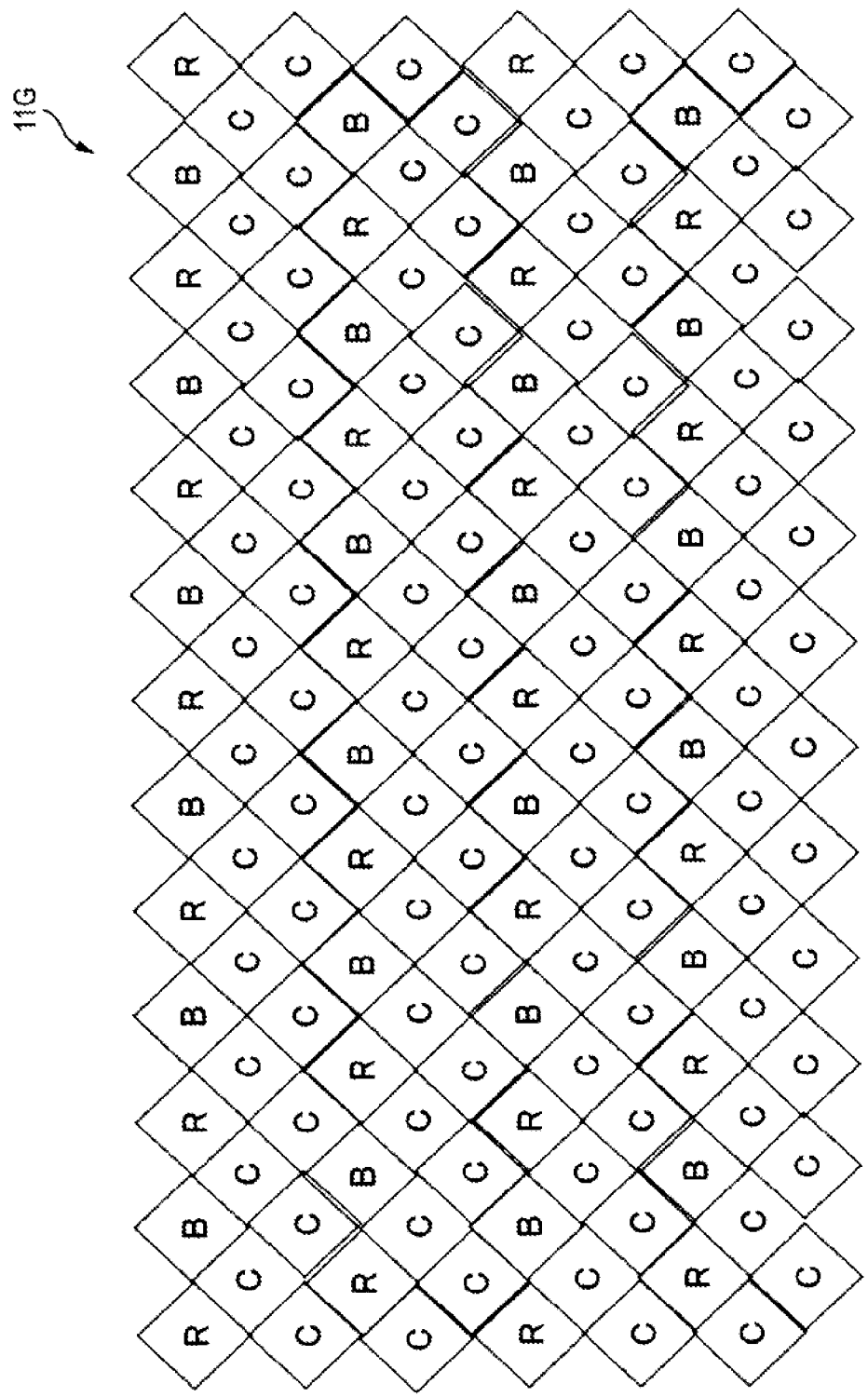
FIG. 26 shows a diagram depicting an eight exemplary pixel arrangement of the pixel array part according to the embodiment.

FIG. 26 shows a diagram depicting an eighth exemplary pixel arrangement of the pixel array part according to the embodiment.

The pixel arrangement of a pixel array part 11G shown in FIG. 26 is an arrangement in which the color filter pixel (color pixel) G is further removed from the pixel arrangement shown in FIG. 25, the pixel row including the clear pixel C is increased, and the pixel column including the clear pixel C is formed in every column.

In this case, information about the color signal is formed based on information about the clear pixel and/or information about the color filters (color pixels) R and B having the spectral characteristics shown in FIG. 4.

Also in the pixel arrangement, the shutter can be released separately from the portions of the color pixel, and the clear pixel can be read separately.

Figure 27:
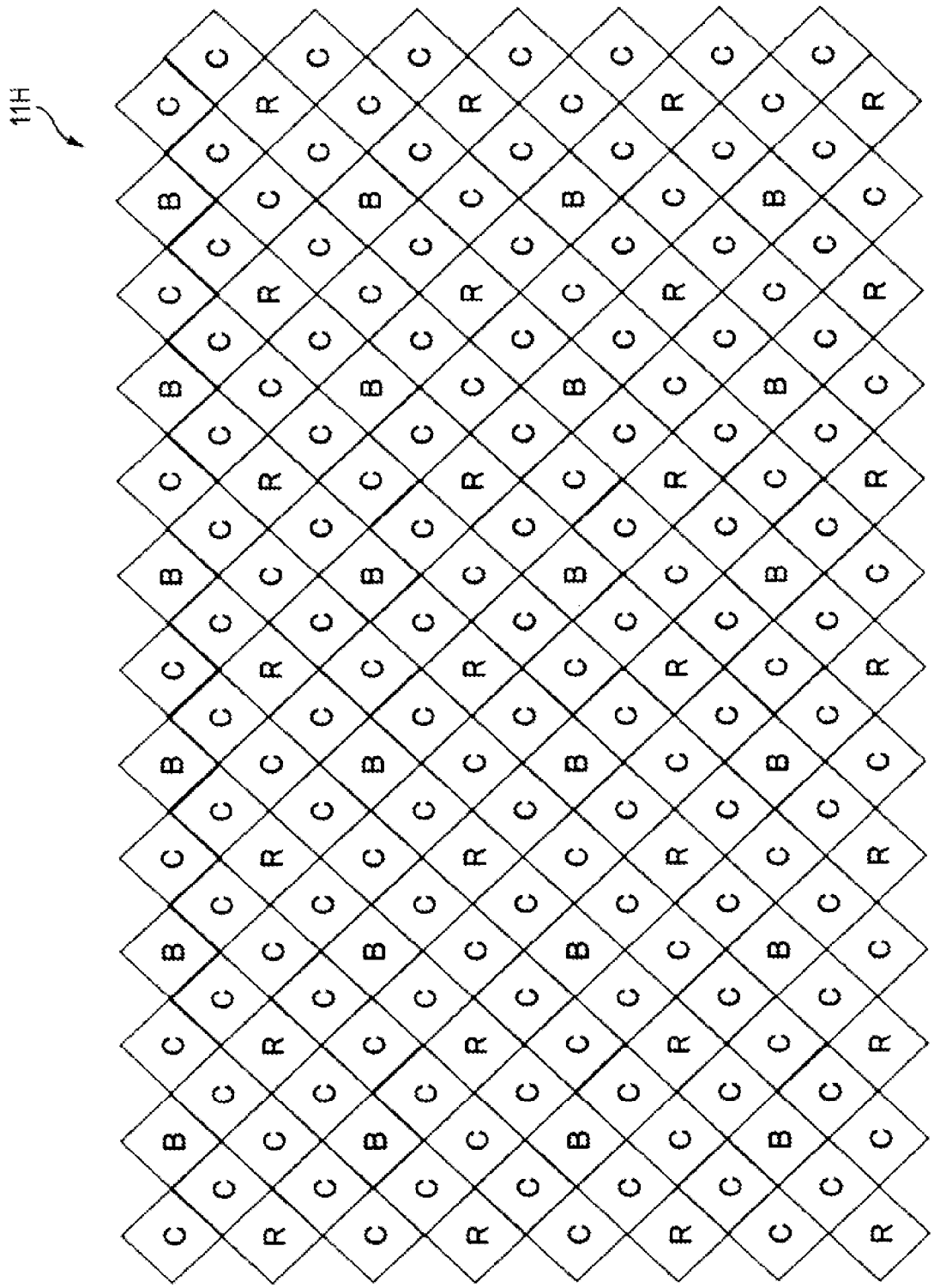
FIG. 27 shows a diagram depicting a ninth exemplary pixel arrangement of the pixel array part according to the embodiment.

FIG. 27 shows a diagram depicting a ninth exemplary pixel arrangement of the pixel array part according to the embodiment.

The pixel arrangement of a pixel array part 11H shown in FIG. 27 is an arrangement in which the color filter pixel (color pixel) G is further removed from the pixel arrangement shown in FIG. 25, the pixel row including the clear pixel C is increased, and the pixel column including the clear pixel C is formed in every column. In this case, the pixel row including the color filter pixel (color pixel) is formed to have the pixel row including only the color filter pixel (color pixel) B and the clear pixel C and the pixel row including only the color filter pixel (color pixel) R and the clear pixel C.

In this case, information about the color signal is formed based on information about the clear pixel and/or information about the color filters (color pixels) R and B having the spectral characteristics shown in FIG. 4.

Also in the pixel arrangement, the shutter can be released separately from the portions of the color pixel, and the clear pixel can be read separately.

As described above, exemplary configurations of the oblique pixel array has been described. In the pixel arrangement, the characteristic configuration, in which the shutter can be released separately from the portions of the color pixel and the clear pixel can be read separately, can be adapted not only to the oblique pixel array but also to the pixel arrangements of the rectangular array as shown in FIGS. 28 to 36, for example, and the same advantages can be obtained as those in the oblique array.

Figure 32:
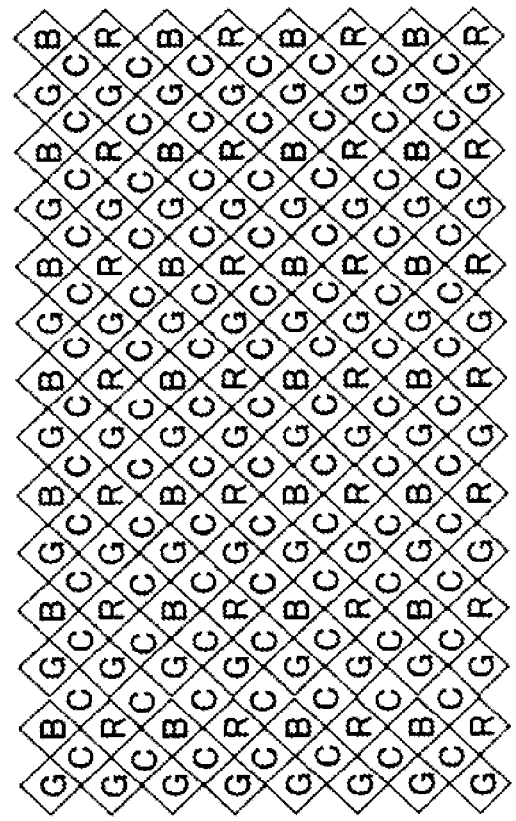
FIG. 32 shows a diagram depicting an example in which the oblique pixel array shown in FIG. 23 is rotated into the rectangular array.
Figure 33:
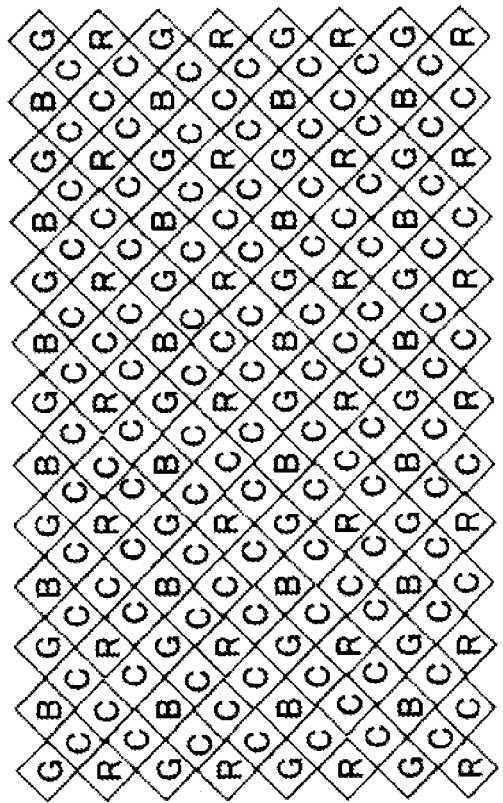
FIG. 33 shows a diagram depicting an example in which the oblique pixel array shown in FIG. 24 is rotated into the rectangular array.
Figure 34:
FIG. 34 shows a diagram depicting an example in which the oblique pixel array shown in FIG. 25 is rotated into the rectangular array.
Figure 35:
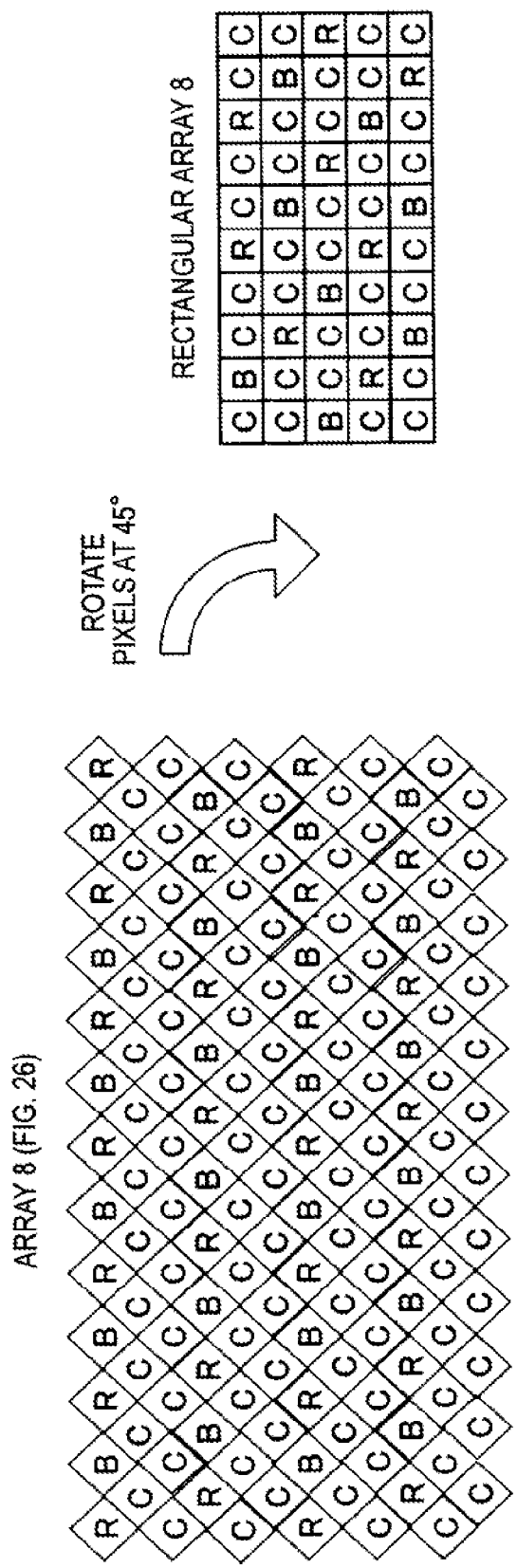
FIG. 35 shows a diagram depicting an example in which the oblique pixel array shown in FIG. 26 is rotated into the rectangular array.
Figure 36:
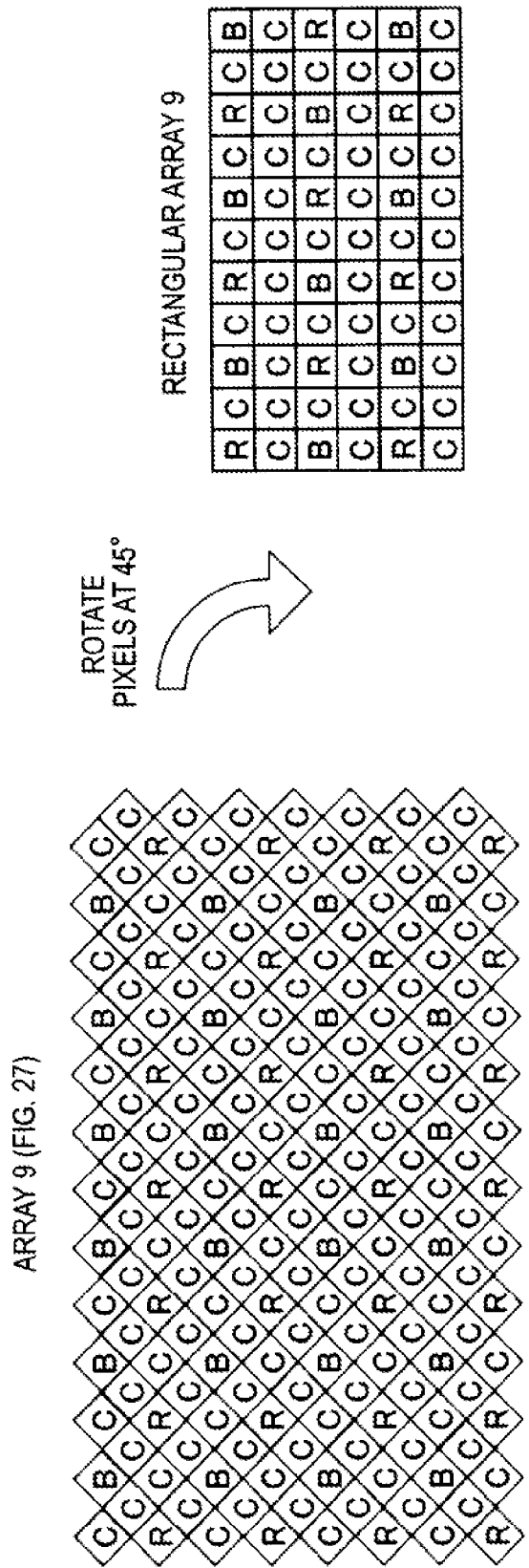
FIG. 36 shows a diagram depicting an example in which the oblique pixel array shown in FIG. 27 is rotated into the rectangular array.

FIG. 28 shows an example in which the oblique pixel array shown in FIG. 4 is turned to the rectangular array, FIG. 29 shows an example in which the oblique pixel array shown in FIG. 19 is turned to the rectangular array, FIG. 30 shows an example in which the oblique pixel array shown in FIG. 21 is turned to the rectangular array, FIG. 31 shows an example in which the oblique pixel array shown in FIG. 22 is turned to the rectangular array, FIG. 32 shows an example in which the oblique pixel array shown in FIG. 23 is turned to the rectangular array, FIG. 33 shows an example in which the oblique pixel array shown in FIG. 24 is turned to the rectangular array, FIG. 34 shows an example in which the oblique pixel array shown in FIG. 25 is turned to the rectangular array, FIG. 35 shows an example in which the oblique pixel array shown in FIG. 26 is turned to the rectangular array, and FIG. 36 shows an example in which the oblique pixel array shown in FIG. 27 is turned to the rectangular array.

In addition, the rectangular array, as shown in FIG. 37, as similar to FIG. 20, the shutter wiring and the clear pixel wiring for the color filter pixel (color pixel) are wired to a single row, more specifically, a color pixel reset wiring RSTL1 and a clear pixel reset wiring RSTL2 are wired.

The configuration of the unit pixel is the same as that in FIG. 2, omitting the detailed description.

Furthermore, as shown in FIG. 38, in the rectangular array (or the oblique array), it may be configured in which the shutter wiring is provided for every color filter pixel and every clear pixel.

In this case, a color pixel reset wirings RSTL1 and RSTL3 and a clear pixel reset wiring RSTL2 are wired.

The configuration of the unit pixel is the same as that in FIG. 2, omitting the detailed description.

Figure 39:
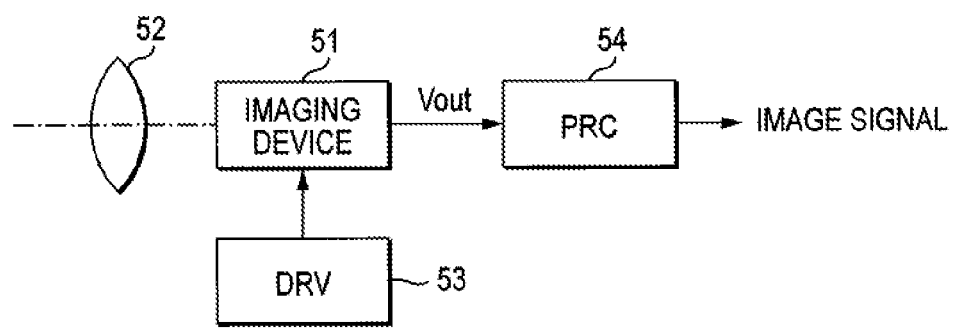
FIG. 39 shows a block diagram depicting the outline of the configuration of a camera system according to an embodiment of the invention.

FIG. 39 shows a block diagram depicting the outline of the configuration of a camera system according to an embodiment of the invention.

A camera system 50 is configured to have an imaging device 51, an optical system which leads incident light into the pixel area of the imaging device 51, for example, a lens 52 which forms incident light (image) onto the imaging area, a drive circuit 53 which drives the imaging device 51, and a signal processing circuit 54 which processes the output signal of the imaging device 51.

In the camera system 50, as the imaging device 51, the imaging device according to the embodiment is sued.

The drive circuit 53 is a circuit also corresponding to the timing control part shown in FIG. 1, which drives the imaging device 51.

The signal processing circuit 54 applies various signal processes to the output signal Vout of the imaging device 51, and outputs it as a video signal.

As described above, according to the camera system, the imaging device according to the embodiment is used as the imaging device 51, whereby high speed operation can be secured. Therefore, a high quality image with less noise can be obtained in a small circuit scale at low power consumption.

In addition, the imaging device according to an embodiment of the invention may be a single chip imaging device, or may be a module imaging device which is formed as an assembly of a plurality of chips. When it is an imaging device formed as an assembly of a plurality of chips, chips are fabricated separately such as a sensor chip, and a signal processing chip for digital signal processing, and it may be further include an optical system.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising a pixel array on a substrate in which a plurality of pixels are arranged in an array, the plurality of pixels configured to convert light into electric signals, said plurality of pixels comprising a plurality of color pixels and at least one clear pixel, wherein:
the plurality of color pixels include at least two of (i) a first color pixel with a first filter effective to cause the first color pixel to have a peak spectral sensitivity for red light, (ii) a second color pixel with a second filter effective to cause the second color pixel to have a peak spectral sensitivity for blue light, or (iii) a third color pixel with a third filter effective to cause the third color pixel to have a peak spectral sensitivity for green light;
the clear pixel has a fourth filter effective to cause the clear pixel to have a high transmittance to white light;
the plurality of pixels include respective micro lenses disposed at light incident sides of the pixels;
the first, second, third color filters are each thicker in a depth direction of the pixels than the fourth filter; and
the clear pixel is adjacent one of the plurality of color pixels.

2. The imaging device of claim 1, wherein, in cross section, the fourth filter of the clear pixel and the first, second, or third color filter of the color pixel adjacent the clear pixel have upper surfaces with heights, as measured from a major surface of the substrate, that differ an impart a stepped structure.

3. The imaging device of claim 1, wherein, in cross section, an upper surface of the fourth filter of the clear pixel, has a height, as measured from a major surface of the substrate, that is less than heights of upper surfaces of the first, second, and third color filters of the first, second, and third color pixels, respectively.

4. The imaging system of claim 1, wherein the at least one clear pixel is in the middle of a sub-array with a Bayer arrangement.

5. The imaging system of claim 1, wherein for each of one of the color pixels, the one of that color pixel is in the middle of a rectangular sub-array of pixels and the electric signals of five color pixels in the sub-array of the same color as the one of the color pixels are added together and the result is read out via the second read channel.

6. The imaging system of claim 1, wherein the pixel array is rectangular and contains only first and second color pixels and clear pixels, and the pixels are arranged such that the clear pixels are present only in odd diagonal lines and the first and second color pixels are present only in even diagonal lines.

7. The imaging system of claim 1, wherein the pixel array is rectangular and contains only first and second color pixels and clear pixels, and the pixels are arranged such that the clear pixels are present only in two adjacent diagonal lines and the first and second color pixels are present only in every third diagonal line.

8. The imaging system of claim 1, wherein the pixel array is rectangular and contains only first and second color pixels and clear pixels, and the pixels are arranged such that every other column is comprised only of clear pixels and, in the remaining columns, the pixels alternate between the first color filter and the second color pixels and a clear pixel.

9. A camera system comprising the imaging system of claim 1, wherein:

the at least one clear pixel is arranged in the array at a given position of a given row and a given column with respect to a first color pixel, a second color pixel, and a third color pixel; and a first read channel is exclusively coupled to the at least one clear pixel and a second read channel is exclusively coupled to the plurality of color pixels.

10. The camera system of claim 9, wherein the first read channel and the second read channel are at opposite sides of the array.

11. The camera system of claim 9, wherein, in cross section, the fourth filter of the clear pixel and the first, second, or third color filter of the color pixel adjacent the clear pixel have upper surfaces with heights, as measured from a major surface of the substrate, that differ an impart a stepped structure.

12. The camera system of claim 9, wherein, in cross section, an upper surface of the fourth filter of the clear pixel, has a height, as measured from a major surface of the substrate, that is less than heights of upper surfaces of the first, second, and third color filters of the first, second, and third color pixels, respectively.

13. The camera system of claim 9, wherein the at least one clear pixel is in the middle of a sub-array with a Bayer arrangement.

14. The camera system of claim 9, wherein the at least one clear pixel is in the middle of a sub-array with a Bayer arrangement and the electric signals of eight color pixels of the sub-array and the at least one clear pixel are added together and the result is read out via the first read channel.

15. The camera system of claim 9, wherein for each of one of the color pixels, the one of that color pixel is in the middle of a rectangular sub-array of pixels and the electric signals of nine color pixels in the sub-array of the same color as the one of the color pixels are added together and the result is read out via the second read channel.

16. The camera system of claim 9, wherein the at least one clear pixel is in the middle of a sub-array with a Bayer arrangement and the electric signals of the at least one clear pixel and four other clear pixels in the sub-array are added together and then read out via the first channel.

17. The camera system of claim 9, wherein for each of one of the color pixels, the one of that color pixel is in the middle of a rectangular sub-array of pixels and the electric signals of five color pixels in the sub-array of the same color as the one of the color pixels are added together and the result is read out via the second read channel.

18. The camera system of claim 9, wherein the pixel array is rectangular and contains only first and second color pixels and clear pixels, and the pixels are arranged such that the clear pixels are present only in odd diagonal lines and the first and second color pixels are present only in even diagonal lines.

19. The camera system of claim 9, wherein the pixel array is rectangular and contains only first and second color pixels and clear pixels, and the pixels are arranged such that the clear pixels are present only in two adjacent diagonal lines and the first and second color pixels are present only in every third diagonal line.

20. The camera system of claim 9, wherein the pixel array is rectangular and contains only the first and second color pixels and clear pixels, and the pixels are arranged such that every other column is comprised only of clear pixels and, in the remaining columns, the pixels alternate between the first color filter and the second color pixels and a clear pixel.

* * * * *